US008009466B2

(12) United States Patent
Sakimura et al.

(10) Patent No.: US 8,009,466 B2
(45) Date of Patent: Aug. 30, 2011

(54) SEMICONDUCTOR STORAGE DEVICE

(75) Inventors: Noboru Sakimura, Tokyo (JP); Takeshi Honda, Tokyo (JP); Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 78 days.

(21) Appl. No.: 12/527,993

(22) PCT Filed: Feb. 7, 2008

(86) PCT No.: PCT/JP2008/052059
§ 371 (c)(1),
(2), (4) Date: Aug. 20, 2009

(87) PCT Pub. No.: WO2008/102650
PCT Pub. Date: Aug. 28, 2008

(65) Prior Publication Data
US 2010/0097845 A1    Apr. 22, 2010

(30) Foreign Application Priority Data
Feb. 21, 2007   (JP) .................................. 2007-041204

(51) Int. Cl.
*G11C 11/00*   (2006.01)
(52) U.S. Cl. ........................................ 365/158; 365/171
(58) Field of Classification Search .................. 365/158, 365/171, 173, 175
See application file for complete search history.

(56) References Cited

U.S. PATENT DOCUMENTS

| 5,640,343 | A | 6/1997 | Gallagher et al. |
| 6,545,906 | B1 | 4/2003 | Savtchenko et al. |
| 6,795,340 | B2 * | 9/2004 | Sakimura et al. ............. 365/171 |
| 6,834,005 | B1 | 12/2004 | Parkin |
| 7,064,974 | B2 | 6/2006 | Suzuki et al. |
| 7,184,301 | B2 | 2/2007 | Sugibayashi et al. |
| 7,254,057 | B2 * | 8/2007 | Hidaka ......................... 365/171 |
| 2004/0100835 | A1 * | 5/2004 | Sugibayashi et al. ......... 365/200 |
| 2005/0002229 | A1 | 1/2005 | Matsutera et al. |

FOREIGN PATENT DOCUMENTS

| JP | 11-195824 A | 7/1999 |
| JP | 2000012790 A | 1/2000 |
| JP | 2002190579 A | 7/2002 |
| JP | 2002197852 A | 7/2002 |

(Continued)

OTHER PUBLICATIONS

International Search Report for PCT/JP2008/052059 mailed May 13, 2008.

(Continued)

*Primary Examiner* — Vu A Le

(57) ABSTRACT

A semiconductor storage device is provided with a memory array including a plurality of memory cells. The plurality of memory cells includes: first and third memory cells arranged along one of an even-numbered row and an odd-numbered row, and a second memory cell arranged along the other. Each of the plurality of memory cells includes: a first transistor comprising first and second diffusion layers; a second transistor comprising third and fourth diffusion layers; and a magnetoresistance element having one of terminals thereof connected to an interconnection layer which provides an electrical connection between the second and third diffusion layers. The fourth diffusion layer of the first memory cell is also used as the first diffusion layer of the second memory cell. In addition, the fourth diffusion layer of the second memory cell is also used as the first diffusion layer of the third memory cell.

10 Claims, 12 Drawing Sheets

FOREIGN PATENT DOCUMENTS

| | | |
|---|---|---|
| JP | 2003281880 A | 10/2003 |
| JP | 2003346474 A | 12/2003 |
| JP | 2004348934 A | 12/2004 |
| JP | 2005505889 A | 2/2005 |
| JP | 2005093488 A | 4/2005 |
| JP | 2005191032 A | 7/2005 |
| JP | 2006073930 A | 3/2006 |
| JP | 2006270069 A | 10/2006 |

OTHER PUBLICATIONS

K. Yagami et al., "Research Trends in Spin Transfer Magnetization Switching", Journal of the Magnetics Society of Japan, vol. 28, No. 9, 2004, pp. 937-948.

A. Yamaguchi et al., "Real Space Observation of Current-Driven Wall Motion in Submicron Magnetic Wires", Physical Reveiw Letters, vol. 92, No. 7, Feb. 20, 2004, pp. 077205-1~4.

\* cited by examiner

Fig. 7

| YA | XA | Din | WBL0 | /WBL0 | WBL1 | /WBL1 | WBL2 | /WBL2 | WBL3 | /WBL3 | WBL4 |
|---|---|---|---|---|---|---|---|---|---|---|---|
| 0 | EVEN | 1 | H | L | L | L | L | L | L | L | L |
| 0 | EVEN | 0 | L | H | L | L | L | L | L | L | L |
| 0 | ODD | 1 | L | H | L | L | L | L | L | L | L |
| 0 | ODD | 0 | L | L | H | L | L | L | L | L | L |
| 1 | EVEN | 1 | L | L | H | L | L | L | L | L | L |
| 1 | EVEN | 0 | L | L | L | H | L | L | L | L | L |
| 1 | ODD | 1 | L | L | L | H | L | L | L | L | L |
| 1 | ODD | 0 | L | L | L | L | H | L | L | L | L |
| 2 | EVEN | 1 | L | L | L | L | H | L | L | L | L |
| 2 | EVEN | 0 | L | L | L | L | L | H | L | L | L |
| 2 | ODD | 1 | L | L | L | L | L | H | L | L | L |
| 2 | ODD | 0 | L | L | L | L | L | L | H | L | L |
| 3 | EVEN | 1 | L | L | L | L | L | L | H | L | L |
| 3 | EVEN | 0 | L | L | L | L | L | L | L | H | L |
| 3 | ODD | 1 | L | L | L | L | L | L | L | H | L |
| 3 | ODD | 0 | L | L | L | L | L | L | L | L | H |

Fig. 8

| OPERATION MODE | LSB OF ROW ADDRESS | WORD LINE | | REFERENCE WORD LINE | |
|---|---|---|---|---|---|
| | | WL0, 2, 4, ⋯ | WL1, 3, 5, ⋯ | WLR0 | WLR1 |
| READ | X0=0 | H | L | L | H |
| READ | X0=1 | L | H | H | L |
| WRITE | X0=0 | H | L | L | L |
| WRITE | X0=1 | L | H | L | L |
| REFERENCE CELL PROGRAM | X0=0 | L | L | H | L |
| REFERENCE CELL PROGRAM | X0=1 | L | L | L | H |

SEMICONDUCTOR STORAGE DEVICE

This application is the National Phase of PCT/JP2008/052059, filed Feb. 7, 2008, which is based upon and claims priority from Japanese Patent Application No. 2007-041204 filed Feb. 21, 2007.

TECHNICAL FIELD

The present invention relates to a semiconductor storage device, and more particularly, to a semiconductor storage device in which a magnetoresistance element (MTJ: Magnetic Tunnel Junction) is incorporated into a memory cell as a memory element, i.e., a magnetic random access memory (MRAM). This application claims priority based on Japanese patent application No. 2007-041204, the disclosure of which is incorporated herein by reference.

BACKGROUND ART

An MTJ element used for a memory cell of an MRAM includes a fixed magnetic layer, a free magnetic layer, and a tunnel insulating film. In the fixed magnetic layer, the direction of the magnetization is fixed to an arbitrary direction. In the free magnetic layer, the direction of the magnetization is changeable by an external magnetic field. The tunnel insulating film is sandwiched between these two magnetic layers. In the MRAM, one-bit storage information is allocated to the relative magnetization state between the fixed magnetic layer and the free magnetic layer. For example, in the case where the magnetization of the fixed magnetic layer and the magnetization of the free magnetic layer are directed to the same direction, i.e., in the case of the parallel state, the magnetization state is defined as "0". In the case where the magnetization of the fixed magnetic layer and the magnetization of the free magnetic layer have directions different from each other by 180 degrees, i.e., in the case of the antiparallel state, the magnetization state is defined as "1". Further, a read operation of the MRAM is implemented by using the fact that the resistance value of the MTJ element varies depending on the above-mentioned magnetization state. FIG. 1 is a schematic diagram illustrating a typical write principle of the MRAM. A write current ix is flowed through a write word line extending parallel to the easy magnetization axis of a magnetic layer, and a write current Iy is flowed through a write bit line extending perpendicular to the easy magnetization axis. As a result, a synthetic magnetic field generated by these write currents reverses the magnetization of the free magnetic layer (cell A). As described, the magnetization reversal characteristics of the MTJ element are used to select a memory cell and to perform a write operation. FIG. 2 is a graph illustrating a relationship between the write currents and the write margin. The vertical axis and the horizontal axis represent the write current Ix and write current Iy, respectively. The write current has an upper limit and a lower limit (in the diagram, indicated as the "operational margin"). The write margin is narrow. For this reason, in order to selectively perform writing into the selected memory cell (cell A), it is necessary to accurately control the current value and the current waveform. This complicates the current source circuit, and make it difficult to perform a high-speed write operation at 100 MHz or more.

A memory cell (2-Transistor-1-MTJ element type memory cell: 2T1MTJ cell) in which a write current is electrically selected with a transistor or a diode is disclosed in Japanese Laid-Open Patent Application No. JP-A 2004-348934 (US 2004/100835A1). FIG. 3 is a schematic diagram illustrating the configuration of the 2T1MTJ cell in this conventional technique. As illustrated in FIG. 3, the 2T1MTJ cell includes: a transistor 111 connecting a bit line BL with a write line 115; a transistor 112 connecting a bit line /BL with the write line 115; and an MTJ element 113 directly placed on the write line 115. In a write operation, the word line WL associated with the selected memory cell is activated to place the transistors 111 and 112 into the ON state. This causes a write current Iw flowing through the bit lines BL and /BL to flow through the write line 115. At this time, the magnetization of the MTJ element 113 is reversed by a write magnetic field Hw generated by the write current Iw. It should be noted that the bit lines BL and /BL are formed in an interconnection layer sufficiently distant from the MTJ element 113 such that the magnetic field generated by the write current not flowing through the write line 115 but flowing only through the bit lines BL and /BL does not reverse the magnetization of the MTJ element 113. For example, in the case where the MTJ element 113 is formed between a third layer interconnection and a fourth layer interconnection, a first layer interconnection may be used for the bit lines. As described, one feature is that a memory cell in a non-selection state is not supplied with the write magnetic field Hw to eliminate the half-selection state. Accordingly, the writing method using the 2T1MTJ cell dramatically improves the selectivity of the memory cells in writing, and also eliminates the need for accurately controlling the write current value or the current waveform. Accordingly, the write circuit can be simplified with the use of a logic circuit like a decoder of an SRAM, and therefore a high-speed write operation at a GHz level can be achieved.

As described above, the 2T1MTJ cell achieves a high-speed write operation as an SRAM, as compared with a write method used in a conventional MRAM. However, a same read method as in the conventional MRAM is used, and therefore the operation speed of the 2T1MTJ cell is limited by the read speed.

FIG. 4 is a circuit block diagram illustrating a basic configuration of an MRAM 101 using the 2T1MTJ cell. A memory array 102 includes cell columns in which the 2T1MTJ cells C (also simply referred to as cells) are arranged in a matrix form, and reference cell columns in which two columns of reference cells R are arranged.

In a write operation, a row decoder 103 selects a selection word line WL from a plurality of word lines WL. A column decoder 104 selects at least one pair of selection bit lines BL and /BL from a plurality of bit lines BL with switches 106. That is, by the selection word line WL and selection bit lines BL and /BL, at least one selection cell C into which data is to be written is selected from the plurality of memory cells C. The selection cell C is electrically connected to the column decoder 104 with the switch 106. Then, a write current Iw from a write current circuit (not shown) is flowed through a path from the column decoder 104 to the selection bit line BL, to the write line 115 of selection cell C, to the selection bit line /BL and to the column decoder 104.

In reading, on the other hand, the row decoder 103 selects a selection word line WL from the plurality of word lines WL. The column decoder 104 selects a selection bit line BL from the plurality of bit lines BL with switches 107. That is, by the selection word line WL and the selection bit line BL, a selection cell C from which stored data is to be read is selected from the plurality of memory cells C. The selection cell C is electrically connected to one of input terminals of a sense amplifier 105 with the switch 107. A sense current $I_R$ to flow through an MTJ element 113 of the selection cell C is generated, and supplied to the one input terminal of the sense amplifier 105.

At the same time, the column decoder 104 continuously places two reference bit lines BLR0 and BLR1 into the selected state with the switches 107. That is, by the selection word line WL and two reference bit lines BLR0 and BLR1, selection reference cells R0 and R1 are simultaneously selected from a plurality of reference cells R0 respectively stored with data "0" and a plurality of reference cells R1 respectively stored with data "1". The selection reference cells R0 and R1 are electrically connected to the other input terminal of the sense amplifier 105 with the switches 107. A reference current Iref (0) flowing through an MTJ element of the reference cell R0, and Iref (1) flowing through an MTJ element of the reference cell R1 are averaged to thereby generate a reference voltage Vref used as a read criterion, which is supplied to the other input terminal of the sense amplifier 105.

That is, the one of the two input terminals of the sense amplifier 105 is connected with the selection cell C, and the other input terminal is connected with the selection reference cells R0 and R1. Therefore, load capacitances of the two input terminals of the sense amplifier are not the same. Accordingly, the speed at which a sense signal (the sense current $I_{R0}$ flowing through the selection cell C) is settled, and the speed at which the reference signal (the reference currents Iref flowing through the reference cells) is settled are different. Accordingly, the identification operation of the sense amplifier 105 cannot be performed before the sense signal and the reference signals are sufficiently settled, and therefore the read speed is limited. Also, the variations in the power supply voltage, and the influence of capacitance coupling between interconnections are not constant, and therefore this technique is disadvantageous also in terms of the noise tolerance. Accordingly, it is not easy to increase the read speed of the MRAM using the 2T1MTJ cell. As a result, the operation speed of the MRAM, i.e., the random access time is limited by the read time of 10 ns or more.

A configuration of an MRAM to achieve a high-speed read operation is disclosed in Japanese Laid-Open Patent Application No. JP-A 2002-197852 (U.S. Pat. No. 6,349,054 B1). According to this document, memory cells in even-numbered rows connected to bit lines BL, and memory cells in odd-numbered rows connected to bit lines /BLs constitute a memory array. Dummy cells (equivalent to the above-described reference cells) used for the read criterion are also provided for each of the even-numbered and odd-numbered rows. The dummy cell retains a resistance value that is an intermediate between the resistance value Rlow corresponding to data "0" and the resistance value Rhigh corresponding to data "1". Also, in the case where a memory cell in an even-numbered row is selected, a dummy cell in an odd-numbered row is used, whereas in the case where a memory cell in an odd-numbered row is selected, a dummy cell in an even-numbered row is used. According to this technique, load capacitances of the bit lines BL and /BL are adjusted to be equal to each other, and therefore the read time is improved. However, the same writing method as in the conventional MRAM illustrated in FIG. 1 is used, and therefore the operation speed in this technique, i.e., the random access time is limited by a write time of 10 ns or more. Also, the cell area is increased as compared with the case where memory cells are arranged in a matrix form.

As described above, it is not easy to increase the operation speed (random access time) of the MRAM as that of the SRAM. When the 2T1MTJ cell described in Japanese Laid-Open Patent Application No. JP-A 2004-348934 is used to configure a memory array based on the idea described in Japanese Laid-Open Patent Application No. JP-A 2002-197852, for example, the cell area is increased to approximately 2 times, which is impractical. There is a need for a high-speed semiconductor storage device using a magnetoresistance effect element (e.g., MRAM). There is also a need for a semiconductor storage device using the 2T1MTJ cell (e.g., MRAM), which can achieve a high-speed read operation without cell area overhead, and achieve a high-speed write operation.

As a related technique, a semiconductor device is disclosed in Japanese Laid-Open Patent Application No. JP-A 2000-12790. In this semiconductor device, in which a memory cell array in a memory section of the semiconductor device is divided into a plurality of regions and an even number of I/O lines are assigned and arranged into the divided memory cell array regions, the memory section is designed to provide a predetermined bit configuration. In the bit configuration of the memory section, the basic unit may be nine bits. Among the even number of the I/O lines, two I/O lines respectively assigned to adjacent memory cell array regions may be collected in a single I/O line, and the bit number in the bit configuration of the memory cell section may be made half of the bit number in the predetermined bit configuration.

Japanese Laid-Open Patent Application No. JP-A 2003-281880 (U.S. Pat. No. 6,822,897 B2) discloses a thin film magnetic storage device. The thin film magnetic storage device includes a plurality of memory cells, a plurality of data lines, and pluralities of first and second gate lines. The plurality of memory cells are arranged in rows and columns along first and second directions, and a first group is defined for each group of memory cells adjacent to each other along the first direction, whereas a second group is defined for each group of memory cells adjacent to each other along the second direction. Each of the plurality of data lines is provided along the first direction for each of the first groups. The plurality of first and second gate lines are provided along the second direction, and each of them is provided for each of the second groups. Each of the memory cells includes: a magnetoresistance element having a variable electrical resistance depending on magnetically written storage data; and an access transistor for electrically connecting the magnetoresistance element between the associated data line and a fixed voltage in data reading. Each of the access transistors is turned on and off depending on the voltage of a predetermined one of the associated first and second gate lines, which is predetermined for each of the first groups.

Japanese Laid-Open Patent Application No. JP-A 2003-346474 (U.S. Pat. No. 6,618,317B1) discloses a thin film magnetic storage device. The thin film magnetic storage device includes a memory array, a plurality of bit lines, a plurality of column selection lines, an address decoder, and first and second write control circuits. In the memory array, a plurality of memory cells each storing magnetically written data are arranged in a matrix form. The plurality of bit lines are provided for a plurality of memory cell columns, respectively. The plurality of column selection lines are provided for the plurality of memory cell columns, respectively. Upon data writing, the address decoder sets voltages of the plurality of column selection lines in accordance with the column selection result. The first and second write control circuits are provided for one-side ends and the other-side ends of the plurality of bit lines, respectively, and supply to a selected bit line data write currents having a direction depending on write data in the data writing. The first write control circuit includes: a first driver for, in the data writing, electrically connecting between one of first and second voltages, which depends on the write data, and a first shared node; and a plurality of first switch circuits each of which is provided between the one-side ends of the plurality of bit lines and the first shared node, and turned on depending on the voltage level of corresponding one of the plurality of column selection lines. The second write control circuit includes: a second driver for, in the data writing, electrically connecting between the other one of the first and second voltages, which depends on the write data, and a second shared node; and a plurality of second switch circuits each of which is provided between the other-side ends of the plurality of bit lines and the second shared node, and turned on depending on the voltage level of corresponding one of the plurality of column selection lines.

DISCLOSURE OF INVENTION

An object of the present invention is to provide a semiconductor storage device using magnetoresistance effect elements, which can achieve high-speed operations (read operation and write operation) as in an SRAM (Static Random Access Memory).

Another object of the present invention is to provide a semiconductor storage device using a 2T1MTJ cell, which can achieve a high-speed read operation without cell area overhead, and perform a high-speed write operation.

These objects, other objects, and advantages of the present invention would be easily understood with the following description and the attached drawings.

In one aspect of the present invention, a semiconductor storage device is provided with a memory array including a plurality of memory cells. The plurality of memory cells includes: first and third memory cells arranged along one of an even-numbered row and an odd-numbered row, and a second memory cell arranged along the other. Each of the plurality of memory cells includes: a first transistor comprising first and second diffusion layers; a second transistor comprising third and fourth diffusion layers; and a magnetoresistance element having one of terminals thereof connected to an interconnection layer which provides an electrical connection between the second and third diffusion layers. The fourth diffusion layer of the first memory cell is also used as the first diffusion layer of the second memory cell. In addition, the fourth diffusion layer of the second memory cell is also used as the first diffusion layer of the third memory cell.

The present invention allows performing a high-speed operation in a semiconductor storage device using a magnetoresistance element, as in an SRAM. The present invention also allows performing a high-speed read operation without cell area overhead in a semiconductor storage device using a 2T1MTJ cell, which can achieve a high-speed write operation.

BRIEF DESCRIPTION OF DRAWINGS

FIG. 7 illustrates a truth table regarding control applied voltages to write bit lines in the write operation of the semiconductor storage device in the first embodiment of the present invention;

FIG. 8 illustrates a truth table for programming a reference cell of the semiconductor storage device in the first embodiment of the present invention;

BEST MODE FOR CARRYING OUT THE INVENTION

Embodiments of a semiconductor storage device of the present invention will hereinafter be described referring to the attached drawings.

First Embodiment

Figure 5:
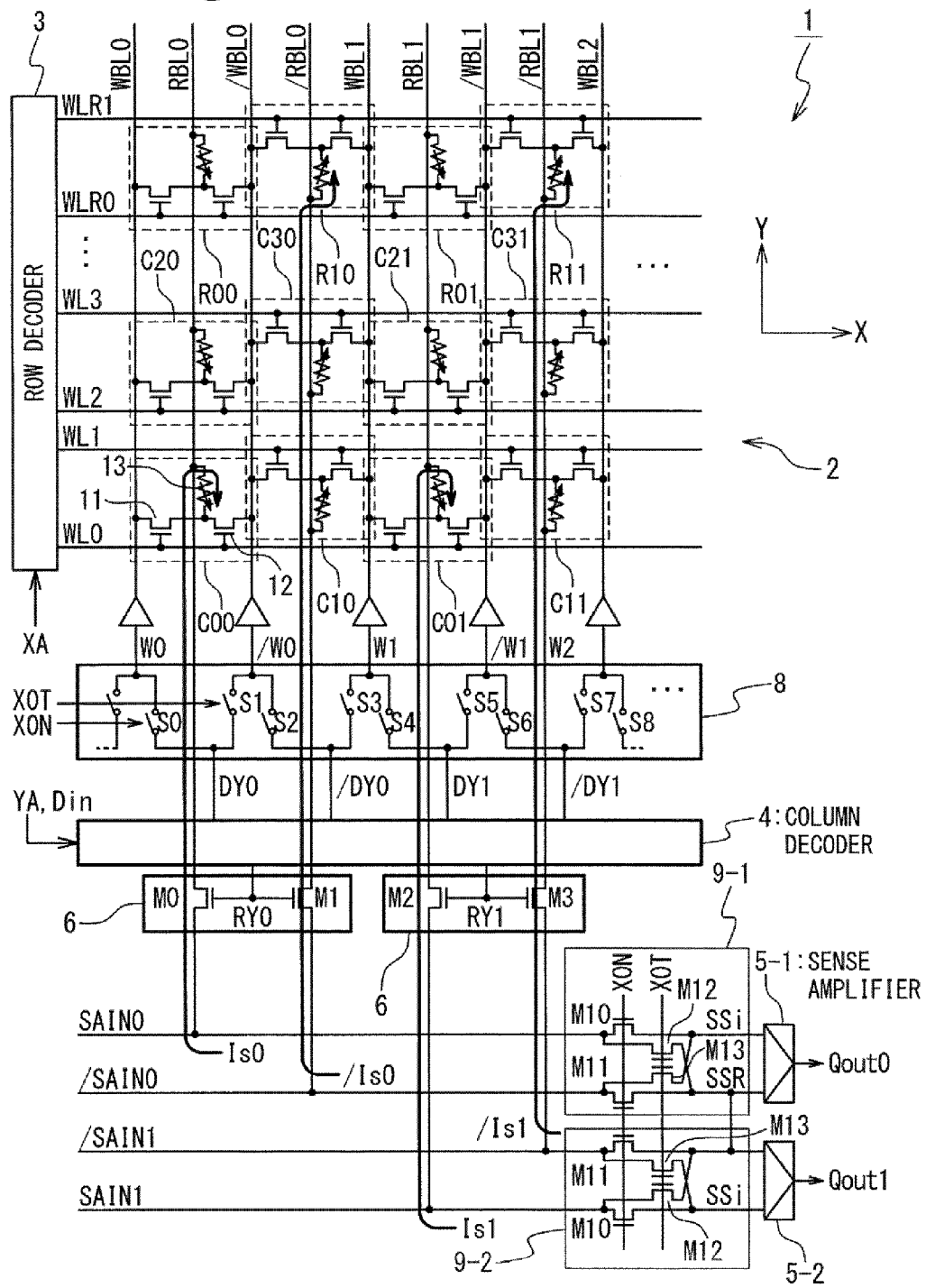
FIG. 5 is a circuit block diagram illustrating a configuration of a semiconductor storage device in a first embodiment of the present invention.
Figure 6:
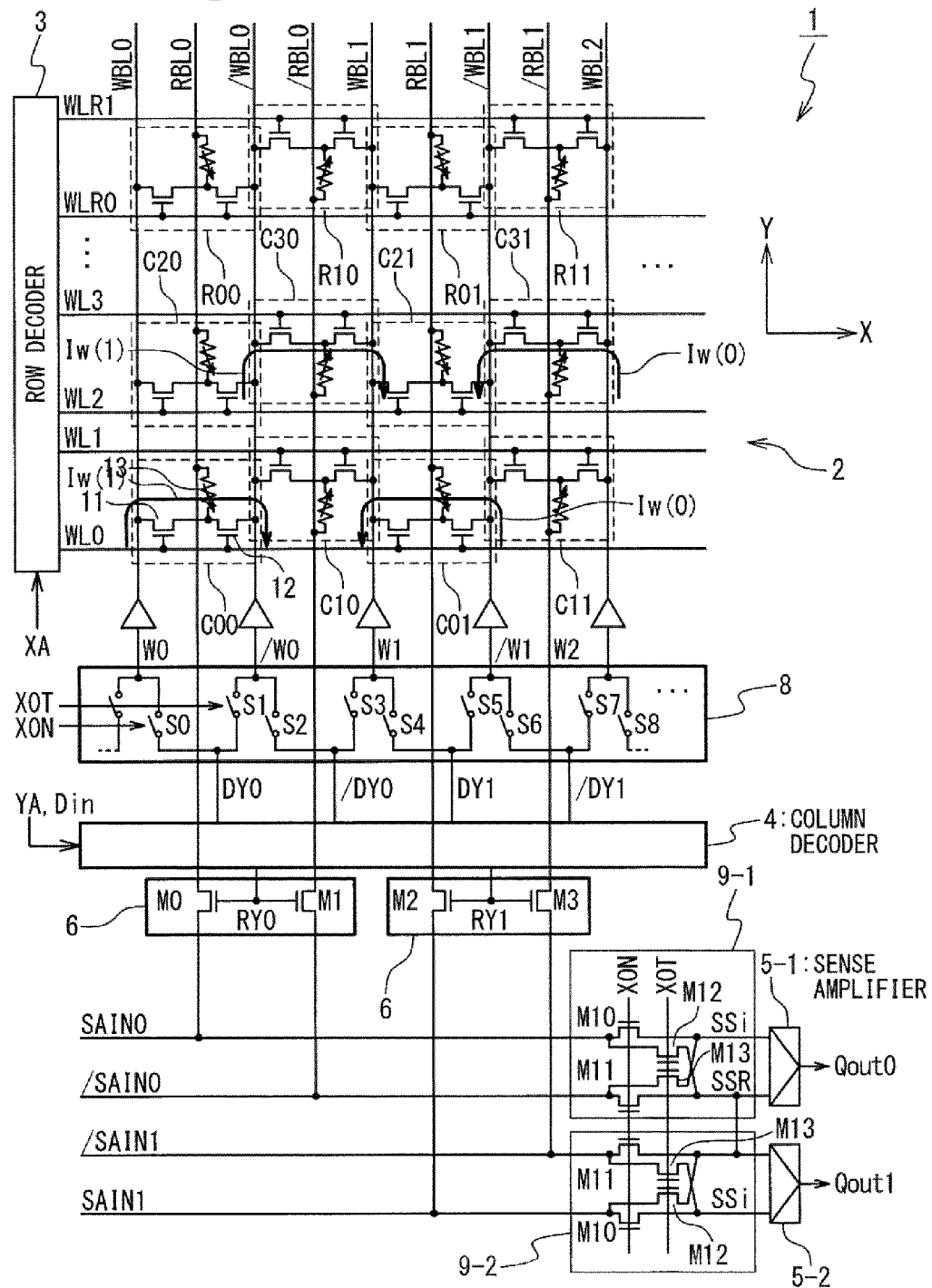
FIG. 6 is a circuit block diagram illustrating the configuration of the semiconductor storage device in the first embodiment of the present invention.

FIGS. 5 and 6 are circuit block diagrams illustrating a configuration of the semiconductor storage device in a first embodiment of the present invention. It should be noted that, in FIG. 5, a path of a sense current in a read operation is also illustrated. In FIG. 6, a path of a write current in a write operation is also illustrated.

The semiconductor storage device 1 is a 2T1MTJ cell type MRAM. The semiconductor storage device 1 includes a memory array 2, a row decoder 3, a column decoder 4, a sense amplifier 5, a first switch section 6, a second switch section 8, and a selector 9.

The memory array 2 includes: a plurality of word lines WLi (i=0 to n: n is a natural number); a plurality of read bit lines RBLj and /RBLj (j=1 to m: m is a natural number); a plurality of write bit lines WBLj and /WBLj; a plurality of memory cells Cij (i=0 to n, j=0 to m); two reference word lines WLR0 and WLR1; and a plurality of reference cells R0j and R1j (j=0 to m). It should be noted a description may be provided with i and j being omitted in the case where the distinction is unnecessary.

The word lines WLi extend in an X direction, and are connected to the row decoder 3. The read bit lines RBLj and /RBLj extend in a Y direction, and are connected to the sense amplifier 5 through the first switch section 6 and the selection part 9. The write bit lines WBLj and /WBLj extend in the Y direction, and are connected to the column decoder 4 through the second switch section 8. The write bit line WBLj, the read bit line RBLj, the write bit line /WBLj, and the read bit line /RBLj are arranged in the X direction in this order. The order may be, for example, an order of the write bit line WBL0, the read bit line RBL0, the write bit line /WBL0, the read bit line /RBL0, the write bit line WBL1, the read bit line RBL1, the write bit line /WBL1, the read bit line /RBL1, . . . .

The memory cells Cij are arranged in rows and columns. For i being even numbers, the memory cells Cij are provided at the associated intersections of the word lines WLi and the write bit lines WBLj (or read bit lines RBLj), respectively. For i being odd numbers, the memory cells Cij are provided at the associated intersections of the word lines WLi with the write bit lines /WBLj (or read bit lines /RBLj), respectively.

The memory cells Cij include: memory cells in even-numbered rows (i=even numbers); and memory cells in odd-numbered rows (i=odd numbers). Regarding the memory cells Cij in the even-numbered rows, for example, memory cells C00, C01, C02, . . . are arranged in the zero-th row (in the diagram, row along a word line WL0) in the X direction, and memory cells C20, C21, C22, . . . are arranged in the second row (in the diagram, row along a word line WL2), in the X direction. The same goes for subsequent rows, i.e., the fourth row, the sixth row . . . . In this case, i takes even numbers. On the other hand, regarding the memory cells Cij in the odd-numbered rows, for example, memory cells C10, C11, C12, . . . are arranged in the first row (in the diagram, row along a word line WL1) in the X direction, and memory cells C30, C31, C32, . . . are arranged in the third row (in the diagram, row along a word line WL3) in the X direction. The same goes for subsequent rows, i.e., the fifth row, the seventh row . . . . In this case, i takes odd numbers.

The memory cells Cij in the even-numbered rows are consequently arranged along even-numbered columns. For example, the memory cells C00, C20, C40 . . . are arranged in the zero-th column (in the diagram, column along the read bit line RBL0) in the Y direction, and the memory cells C01, C21, C41, . . . are arranged in the second column (in the diagram, column along the read bit line RBL1) in the Y direction. The same goes for subsequent columns, i.e., the fourth column, the sixth column . . . . On the other hand, the memory cells Cij in the odd-numbered rows are consequently arranged along odd-numbered columns. For example, the memory cells C10, C30, C50, . . . , are arranged in the first column (in the diagram, column along the read bit line /RBL0) in the Y direction, and the memory cells C11, C31, C51, . . . , are arranged in the third column (in the diagram, column along the read bit line /RBL1) in the Y direction. The same goes for subsequent columns, i.e., a fifth column, a seventh column . . . .

The memory cells Cij each include a first transistor 11, a second transistor 12, and an MTJ element 13. In the memory cells Cij in the even-numbered rows, the MTJ element 13 is connected to the read bit line RBLj on one terminal thereof. The first transistor 11 is connected to the word line WLi on the gate thereof, to the write bit line WBLj on one of the source and drain thereof, and to the other terminal of the MTJ element 13 at the other one thereof (through a write line 15). The second transistor 12 is connected to the word line WLi on the gate thereof, to the write bit line /WBLj on one of the source and drain thereof, and to the other terminal of the MTJ element 13 on the other one thereof (through the write line 15).

In the memory cells Cij in the odd-numbered rows, the MTJ element 13 is connected to the read bit line /RBLj on one terminal thereof. The first transistor 11 is connected to the word line WLi on the gate thereof, to the write bit line /WBLj on one of the source and drain thereof, and to the other terminal of the MTJ element 13 on the other one thereof (through the write line 15). The second transistor 12 is connected to the word line WLi on the gate thereof, to the write bit line WBL(j+1) on one of the source and drain thereof, and to the other terminal of the MTJ element 13 at the other one thereof (through the write line 15).

The write bit lines WBLj and /WBLj are shared by the memory cells in the even-numbered rows (columns) and the memory cells in the odd-numbered rows (columns). For example, the write bit line /WBL0 is shared between the memory cell C00 in the even-numbered row (column) and the memory cell C10 in the odd-numbered row (column), between the memory cells C20 and C30, between the memory cells C40 and C50, . . . . The write bit line WBL1 is shared between the memory cell C10 in the odd-numbered row (column) and the memory cell C01 in the even-numbered row (column), between the memory cells C30 and C21, between the memory cells C50 and C41, . . . . The write bit line /WBL1 is shared between the memory cell C01 in the even-numbered row (column) and the memory cell C11 in the odd-numbered row (column), between the memory cells C21 and C31, between the memory cells C41 and C51, . . . .

The reference word lines WLR0 and WLR1 extend in the X direction, and are connected to the row decoder 3. The reference cells R0j are provided at the associated intersections of the reference word line WLR0 and the write bit lines WBLj (or read bit lines RBLj), respectively. The reference cells R1j are provided at the associated intersections of the reference word line WLR1 (odd-numbered row) and the write bit lines /WBLj (or read bit lines /RBLj), respectively. That is, the reference cells R0j (R00, R01, R02, . . . ) are arranged along the reference word line WLR0 in the even-numbered row, and placed in the above even-numbered columns. On the other hand, the reference cells R1j (R10, R11, R12, . . . ) are arranged along the reference word line WLR1 in the odd-numbered row, and placed in the above odd-numbered columns. These reference cells R0j and R1j form two rows of reference cell rows.

The reference cells R0j and R1j also each include a first transistor 11, a second transistor 12, and a MTJ element 13, similarly to the memory cells C. In the reference cells R0j in the even-numbered row, the MTJ element 13 is connected to the read bit line RBLj on one terminal thereof. The first transistor 11 is connected to the reference word line WLR0 on the gate thereof, to the write bit line WBLj on one of the source and drain thereof, and to the other terminal of the MTJ element 13 on the other one thereof (through the write line 15). The second transistor 12 is connected to the reference word line WLR0 on the gate thereof, to the write bit line /WBLj on one of the source and drain thereof, and to the other terminal of the MTJ element 13 on the other one thereof (through the write line 15).

In the reference cells R1j in the odd-numbered row, the MTJ element 13 is connected to the read bit line /RBLj on one terminal thereof. The first transistor 11 is connected to the reference word line WLR1 on the gate thereof, to the write bit line /WBLj on one of the source and drain thereof, and to the other terminal of the MTJ element 13 on the other one thereof (through the write line 15). The second transistor 12 is connected to the reference word line WLR1 on the gate thereof, to the write bit line WBL(j+1) on one of the source and drain thereof, and to the other terminal of the MTJ element 13 on the other one thereof (through the write line 15).

The write bit lines WBLj and /WBLj are shared between the reference cells R0j in the even-numbered row (columns) and the reference cells R1j in the odd-numbered row (columns). For example, the write bit line /WBL0 is shared between the reference cell R00 in the even-numbered row (column) and the reference cell R10 in the odd-numbered row (column). The write bit line WBL1 is shared between the reference cell R10 in the even-numbered row (column) and the reference cell R01 in the odd-numbered row (column).

In this embodiment, an even-numbered column (a column in which memory cells C and reference cells R are arranged along the read bit line RBLj) and an adjacent odd-numbered column (a column in which memory cells C and reference cells R are arranged along the read bit line /RBLj) form a pair. In the read operation, when a memory cell C belonging to one of the even-numbered column and odd-numbered column in the pair is selected, a reference cell R belonging to the other column in the pair is selected for reference. Then, the read bit line RBLj in the even-numbered column is connected to one of input terminals of the sense amplifier 5, and the read bit line /RBLj in the odd-numbered column in the same pair is connected to the other input terminal of the same sense amplifier 5. That is, the memory cell C from which stored data is to be read, and the reference cell R are prepared in the pair. For example, when the memory cell C00 in the zero-th column (even-numbered column) is selected as the target from which the stored data is to be read, the reference cell R10 in the first column (odd-numbered column) forming a pair with the zero-th column is prepared as a reference cell.

In the read operation, the row decoder 3 selects a selection word line from the plurality of word lines WLi, and a selection reference word line from the two reference word lines WLR0 and WLR1. Also, in the write operation, the row decoder 3 selects a selection word line from the plurality of word lines WLi.

In the read operation, the column decoder 4 selects one selection read bit line pair RBLj and /RBLj from the plurality of read bit line pairs RBLj and /RBLj with the first switch section 6. Also, in the write operation, the column decoder 4 selects one selection write bit line pair WBLj and /WBLj from the plurality of write bit line pairs WBLj and /WBLj with the second switch section 8.

In the read operation, the sense amplifier 5 receives sense signals from the selection read bit lines RBLj and /RBLj on two input terminals thereof to output a sense result. The sense amplifier 5 includes a sense amplifier 5-1 for even-numbered j, and a sense amplifier 5-2 for odd-numbered j. It should be noted that the number of sense amplifiers 5 may be determined as the number of pairs formed by the even-numbered columns and the odd-numbered columns. In this case, a number of data identical to the number of pairs can be simultaneously read.

The selector 9 includes transistors M10, M11, M12, and M13. The selector 9 switches between the input terminals of the sense amplifier 5 on the basis of whether the row address (XA) is even or odd. For example, if a memory cell in an even-numbered column is selected, the signal X0N generated by decoding the least significant bit X0 of the row address is activated and X0T is deactivated; the transistors M10 and M11 are placed into the on state; and the transistors M12 and M13 are placed into the off state. At this time, SAINj is connected to a signal side input terminal SSi of the sense amplifier 5, and /SAINj is connected to a reference side input terminal SSR of the sense amplifier 5.

In this case, the reference side input terminals SSR of the two adjacent sense amplifiers 5 are mutually short-circuited. This allows the reference currents through two reference cells to be averaged to thereby generate a reference signal serving as a read criterion. For example, by preliminarily programming the data "0" into the reference cells R00 and R10, and the data "1" into R01 and R11, an averaged reference current Iref takes an intermediate level between the levels of the sense current Is (0) corresponding to data "0" and the sense current Is (1) corresponding to data "1".

It should be noted that any of the first switch section 6, the second switch section 8, and the selector 9 may be incorporated within the column decoder 4.

Next, the read operation of the semiconductor storage device in the first embodiment of the present invention is described referring to FIG. 5.

In this embodiment, an even-numbered column of the memory cells C forms the same column address (YA=same pair) as the adjacent odd-numbered column (the even-numbered column and the odd-numbered column are distinguished by the row address (XA)). In the case where a memory cell C in the even-numbered column is selected on the basis of the address (XA, YA) inputted in a read mode (in the read operation), a reference cell R in the odd-numbered column positioned at the same column address (belonging to the same pair) is simultaneously selected. For example, when the memory cell C00 in the zero-th column, which is an even-numbered column, is selected, the reference cell R10 in the first column, which is an odd-numbered column, is simultaneously selected. On the other hand, when a memory cell in the odd-numbered column is selected, a reference cell in the even-numbered column positioned at the same column address (belonging to the same pair) is simultaneously selected. For example, when the memory cell C10 in the first column, which is an odd-numbered column, is selected, the reference cell R00 in the zero-th column, which is an even-numbered column, is simultaneously selected.

First, a description is given of a case where at least two sense amplifiers 5 are present, and the memory cells C00 and C01 in the even-numbered columns are simultaneously read for the two sense amplifiers 5 (the sense current path is illustrated in FIG. 5). In the case of reading a memory cell in an even-numbered column, a reference cell in an odd-numbered column in the same pair as the even-numbered column to which the memory cell to be read belongs is selected. It should be noted that the number of simultaneously readable memory cells is equal to or less than the number of sense amplifiers 5.

First, the memory cell C00 in the zero-th column and the reference cell R10 in the corresponding first column are simultaneously selected.

The row decoder 3 selects and activates the word line WL0 as a selection word line on the basis of the row address XA, and turns on the first and second transistors 11 and 12 of the memory cell C00. Correspondingly, the row decoder 3 selects and activates the reference word line WLR1 as a selection reference word line on the basis of the row address XA, and turns on the first and second transistors 11 and 12 of the reference cell R10. Then, the column decoder 4 activates a signal RY0 on the basis of the column address YA to turn on the transistors M0 and M1 of the first switch section 6. This results in that the read bit lines RBL0 and /RBL0 are selected as selection read bit lines. As a result, the memory cell C00 is selected by the word line WL0 and read bit line RBL0. Correspondingly, the reference cell R10 is selected by the reference word line WLR1 and the read bit line /RBL0. Also, the read bit line RBL0 is connected to the input line SAIN0 to the sense amplifier 5 through the transistor M0. The read bit line /RBL0 is connected to the input line /SAIN0 to the sense amplifier 5 through the transistor M1.

Similarly, the memory cell C01 in the second column, and the reference cell R11 in the corresponding third column are simultaneously selected.

The row decoder 3 selects and activates the word line WL0 as a selection word line on the basis of the row address XA, and selects and activates the reference word line WLR1 as a selection reference word line. Accordingly, the first and second transistors 11 and 12 of the memory cell C01 and the reference cell R1 are placed in the on-state.

Then, the column decoder 4 activates a signal RY1 to turn on the transistors M2 and M3 of the first switch section 6 on the basis of the column address YA. This results in that the read bit lines RBL1 and /RBL1 are selected as selection read bit lines. As a result, the memory cell C01 is selected by the word line WL0 and read bit line RBL1. Similarly, the reference cell R11 is selected by the reference word line WLR1 and the read bit line /RBL1. Also, the read bit line RBL1 is connected to the input wiring SAIN1 to the sense amplifier 5 through the transistor M2. The read bit line /RBL1 is connected to the input wiring /SAIN1 to the sense amplifier 5 through the transistor M3.

In the case where the memory cell C00 in the zero-th row (even-numbered row) is selected, the selector 9-1 activates the signal X0N generated by decoding the least significant bit X0 of the row address, and deactivates X0T. As a result, the transistors M10 and M11 are placed into the on state, and the transistors M12 and M13 are placed into the off state. This results in that the input line SAIN0 is connected to the signal side input terminal SSi of the sense amplifier 5, and the input line /SAIN0 is connected to the reference side input terminal SSR of the sense amplifier 5.

On the other hand, in the case where the memory cell C01 in the zero-th row (even-numbered row) is selected, the selector 9-2 activates the signal X0N generated by decoding the least significant bit X0 of the row address, and deactivates X0T. As a result, the transistors M10 and M11 are placed into the on state, and the transistors M12 and M13 are placed into the off state. This results in that the input line SAIN1 is connected to the signal side input terminal SSi of the sense amplifier 5, and the input line /SAIN1 is connected to the reference side input terminal SSR of the sense amplifier 5.

By preliminarily programming the data "0" into the reference cell R10, and the data "1" into the reference cell R11, the averaged reference current Iref takes an intermediate level between the levels of the sense current Is (0) corresponding to data "0" and the sense current Is (1) corresponding to data "1". The sense amplifiers 5-1 and 5-2 supply clamp voltages Vc to the signal side input terminals SSi and reference side input terminals SSR. That is, the input lines SAIN0 and /SAIN0, and selection read bit lines RBL0 and /RBL0 are also applied with Vc. Similarly, the input lines SAIN1 and /SAIN1, and selection read bit lines RBL1 and /RBL1 are also applied with Vc. In the read mode (read operation), all of the write bit lines WBL and /WBL are grounded. Accordingly, the memory cell C00 in the selection state is flowed with a sense current Is0 through the input line SAIN0 and the read bit line RBL0. Similarly, the memory cell C01 in the selection state is flowed with a sense current Is1 through the input line SAIN1 and the read bit line RBL1. On the other hand, the reference cell R10 in the selection state is flowed with a reference current /Is0 through the input line /SAIN0 and the read bit line /RBL0. Similarly, the reference cell R11 is flowed with a reference current /Is1 through the input line /SAIN1 and the read bit line /RBL1. The sense amplifier 5-1 compares the levels of the sense current Is0 and the averaged reference current Iref(=(/Is0+/Is1)/2), and outputs a read result. Similarly, the sense amplifier 5-2 compares the levels of the sense current Is1 and the averaged reference current Iref(=(/Is0+/Is1)/2), and outputs a read result.

Next, a description is given of the case where at least two sense amplifiers 5 are present, and the memory cells C10 and C11 in the odd-numbered columns are simultaneously read for the two sense amplifiers 5 (the sense current path is not illustrated in FIG. 5).

The memory cell C10 in the first column and the reference cell R00 in the corresponding zero-th column are simultaneously selected.

First, the row decoder 3 selects and activates the word line WL1 as a selection word line on the basis of the row address XA, and turns on the first and second transistors 11 and 12 of the memory cell C10. Correspondingly, the row decoder 3 selects and activates the reference word line WLR0 as a selection reference word line on the basis of the row address XA, and turns on the first and second transistors 11 and 12 of the reference cell R00. Then, the column decoder 4 activates the signal RY0 to turn on the transistors M0 and M1 of the first switch section 6 on the basis of the column address YA. This result in that the read bit lines RBL0 and /RBL0 are selected as selection read bit lines. As a result, the memory cell C10 is selected by the word line WL1 and the read bit line /RBL0. Similarly, the reference cell R00 is selected by the reference word line WLR0 and the read bit line RBL0. Also, the read bit line RBL0 is connected to the input line SAIN0 to the sense amplifier 5 through the transistor M0. The read bit line /RBL0 is connected to the input line /SAIN0 to the sense amplifier 5 through the transistor M1.

Similarly, the memory cell C11 in the second column, and the reference cell R01 in the corresponding third column are simultaneously selected.

The row decoder 3 selects and activates the word line WL1 as a selection word line on the basis of the row address XA, and selects and activates the reference word line WLR0 as a selection reference word line. Accordingly, the first and second transistors 11 and 12 of the memory cell C11, and the first and second transistors 11 and 12 of the reference cell R01 are placed into the on state.

Then, the column decoder 4 activates the signal RY1 on the basis of the column address YA to turn on the transistors M2 and M3 of the first switch section 6. This results in that the read bit lines RBL1 and /RBL1 are selected as selection read bit lines. As a result, the memory cell C11 is selected by the word line WL1 and the read bit line /RBL1. Similarly, by the reference word line WLR0 and the read bit line RBL1, the reference cell R01 is selected. Also, the read bit line RBL1 is connected to the input line SAIN1 to the sense amplifier 5 through the transistor M2. The read bit line /RBL1 is connected to the input line /SAIN1 to the sense amplifier 5 through the transistor M3.

In the case where the memory cell C10 in the first row (odd-numbered row) is selected, the selector 9-1 deactivates the signal X0N generated by decoding the least significant bit X0 of the row address, and activates X0T. As a result, the transistors M10 and M11 are placed into the off state, and the transistors M12 and M13 are placed into the ON state. This results in that the input line /SAIN0 is connected to the signal side input terminal SSi of the sense amplifier 5, and the input line SAIN0 is connected to the reference side input terminal SSR of the sense amplifier 5.

On the other hand, when the memory cell C11 in the first row (odd-numbered row) is selected, the selector 9-2 deactivates the signal X0N generated by decoding the least significant bit X0 of the row address, and activates X0T. As a result, the transistors M10 and M11 are placed into the off state, and the transistors M12 and M13 are placed into the on state. This results in that the input line /SAIN1 is connected to the signal side input terminal SSi of the sense amplifier 5, and the input line SAIN1 is connected to the reference side input terminal SSR of the sense amplifier 5.

The sense amplifiers 5-1 and 5-2 supply the clamp voltages Vc to the signal side input terminals SSi and the reference side input terminals SSR. That is, the input lines SAIN0 and /SAIN0, and selection read bit lines RBL0 and /RBL0 are also applied with Vc. Similarly, the input lines SAIN1 and /SAIN1, and selection read bit lines RBL1 and /RBL1 are also applied with Vc. In the read mode (the read operation), all of the write bit lines WBL and /WBL are grounded. Accordingly, the memory cell C10 in the selection state is flowed with the sense current Is0 through the input wiring /SAIN0 and the read bit line /RBL0. Similarly, the memory cell C11 in the selection state is flowed with the sense current Is1 through the input wiring /SAIN1 and read bit line /RBL1. On the other hand, the reference cell R00 in the selection state is flowed with the reference current /Is0 through the input line SAIN0 and read bit line RBL0. Similarly, the reference cell R01 is flowed with the reference current /Is1 through the input wiring SAIN1 and read bit line RBL1. The sense amplifier 5-1 compares the levels of the sense current Is0 and the averaged reference current Iref(=(/Is0+/Is1)/2), and outputs a read result. Similarly, the sense amplifier 5-2 compares the levels of the sense current Is1 and the averaged reference current Iref(=(/Is0+/Is1)/2), and outputs a read result.

In the above-described manner, the read operation of the semiconductor storage device of the first embodiment of the present invention is completed.

As described above, in two adjacent sense amplifiers 5, it is necessary to mutually short-circuit reference side input terminals SSR; to supply a reference current to a reference input terminal SSR of one of the sense amplifiers 5 from a reference cell R storing the data "0"; and to supply a reference current to a reference side input terminal SSR of the other sense amplifier 5 from a reference cell R storing the data "1". Accordingly, even in the case where data is read from one memory cell, control is performed so as to simultaneously select, in addition to a reference cell (e.g., storing "0") for the memory cell, a reference cell storing different data (e.g., "1"). For example, even in the case where data is read from one memory cell, two data are temporarily read as described above.

Next, a description is given of the write operation of the semiconductor storage device in the first embodiment of the present invention referring to FIG. 6. In the diagram, the case where a write current Iw flows in a −X direction (from right to left in the diagram) in a memory cell C is defined as "0" writing, whereas the case where the write current Iw flows in a +X direction (left to right in the diagram) is defined as "1" writing.

Writing into a memory cell C (2T1MTJ cell) is performed by applying complementary voltages to the write bit lines WBLj and /WBLj depending on write data. FIG. 7 illustrates a truth table regarding control of applied voltages to the write bit lines in the write mode (in the write operation) in the first embodiment of the semiconductor storage device of the present invention. "YA" represents a column address. "XA" represents a row address ("even"=even number, "odd"=odd number), "Din" represents input data ("1", "0"), and "WBLj" and "/WBLj" represent states of the write bit lines ("H"=High level, "L"=Low level).

For example, in the case where writing is performed into the memory cell C00 in the zero-th row, which is an even-numbered row (XA="even") of the zero-th pair (YA=0), the row decoder 3 activates the word line WL0. In the case where the input data is "1", the column decoder 4 sets the write bit line WBL0 to the "H" level, and the write bit line /WBL0 to the "L" level. This causes a write current Iw (1) to be supplied in the +X direction. In the case where the input data is "0", the column decoder 4 sets the write bit line WBL0 into the "L" level, and the write bit line /WBL0 into the "H" level. This causes a write current Iw (0) to be supplied in the −X direction (not illustrated).

On the other hand, in the case where writing is performed into the memory cell C10 in the first row, which is an odd-numbered row (XA="odd") of the zero-th pair (YA=0), the row decoder 3 activates the word line WL1. When the input data is "1", the column decoder 4 sets the write bit line /WBL0 to the "H" level, and the write bit line WBL1 to the "L" level. This causes the write current Iw (1) to be supplied in the +X direction. When the input data is "0", the column decoder 4 sets the write bit line /WBL0 to the "L" level, and the write bit line WBL1 to the "H" level. This causes the write current Iw (0) to be supplied in the −X direction (not illustrated).

For example, in the case where writing is performed into the memory cell C01 in the second row, which is an even-numbered row (XA="even") of the first pair (YA=1), the row decoder 3 activates the word line WL0. In the case where the input data is "1", the column decoder 4 sets the write bit line WBL1 to the "H" level, and the write bit line /WBL1 to the "L" level. This causes the write current Iw (1) to be supplied in the +X direction (not illustrated). When the input data is "0", the column decoder 4 sets the write bit line WBL1 to the "L" level, and the write bit line /WBL1 to the "H" level. This causes the write current Iw (0) to be supplied in the −X direction.

On the other hand, if writing is performed into the memory cell C11 in the third row, which is an odd-numbered row (XA="odd") of the first pair (YA=1), the row decoder 3 activates the word line WL1. In the case where the input data is "1", the column decoder 4 sets the write bit line /WBL1 into the "H" level, and the write bit line WBL2 to the "L" level. This causes the write current Iw (1) to be supplied in the +X direction (not illustrated). In the case where the input data is "0", the column decoder 4 sets the write bit line /WBL1 to the "L" level, and the write bit line WBL2 to the "H" level. This causes the write current Iw (0) to be supplied in the −X direction.

The write circuit that provides voltage control for the write bit line RBLj on the basis of the truth table illustrated in FIG. 7 may be achieved by utilizing switches Sk (k=0 to q: q is a natural number) of the second switch section 8 as illustrated in FIG. 6.

For example, when a memory cell in an even-numbered row is selected, X0N is activated; X0T is deactivated; and the switches S0, S2, . . . are placed into the on state. At this time, for example, in the case where writing is performed into the memory cell C00, the column decoder 4 transmits a control signal DY0 to a terminal W0, and a control signal /DY0 to a terminal /W0. This results in that complementary voltages depending on input data can be applied to the write bit lines WBL0 and /WBL0 (on the basis of the truth table in FIG. 7).

On the other hand, in the case where a memory cell in an odd-numbered row is selected, X0N is deactivated; X0T is activated; and the switches S1, S3, . . . are placed into the on state. At this time, for example, in the case where writing is performed into the memory cell C10, the column decoder 4 transmits the control signal DY0 to the terminal /W0, and the control signal /DY0 to a terminal W1. This results in that complementary voltages depending on input data can be applied to the write bit lines /WBL0 and WBL1 (on the basis of the truth table in FIG. 7).

That is, in the present invention, the write current can be flowed by providing complementary voltages to two write bit lines. For example, a write bit line WBL is driven by a buffer (or inverter or the like) of a logic gate using the terminals W0, /W0, . . . in FIG. 6 as inputs. The buffer has a role of a write driver. As is understood from the above discussion, the overhead (addition) of the writing-related circuit is only the switches Sk and terminals W of the second switch section 8, and the switches are typically achieved with CMOS switches, of which area overhead is small.

Next, a description is given a method for programming a reference cell. FIG. 8 illustrates a truth table for programming a reference cell of the semiconductor storage device in the first embodiment of the present invention. The column "Operation mode" represents a type of operation mode (Read, Write, Reference cell programming (reference cell writing)), the column "LSB (Least Significant Bit) of row address" represents whether the least significant bit X0 is even or odd, the column "Word line" represents a state of the word line WLi ("H"=High level, "L"=Low level), and the column "Reference word line" represents states of the reference word lines WLR0 and WLR1 ("H"=High level, "L"=Low level).

In the above-described normal read mode (read operation), when an address (X0=0) to select ("H" level) a memory cell in an even-numbered row (word line WL0, 2, ...) is inputted, the reference word line WLR1 in the odd-numbered row is activated ("H" level). On the other hand, in the case where an address (X0=1) to select ("H" level) a memory cell in an odd-numbered row (word line WL1, 3, ...) is inputted, the reference word line WLR0 in the even-numbered row is activated ("H" level).

Also, in the above-described normal write mode (write operation), the reference word lines WLR0 and WLR1 are both deactivated ("L" level). Further, in the reference cell programming mode, for example, when desired data are written (programmed) into a reference cell in the even-numbered row, the reference word line WLR0 is activated ("H" level). When the programming is performed into a reference cell in the odd-numbered row, the reference word line WLR1 is activated ("H" level).

Figure 9:
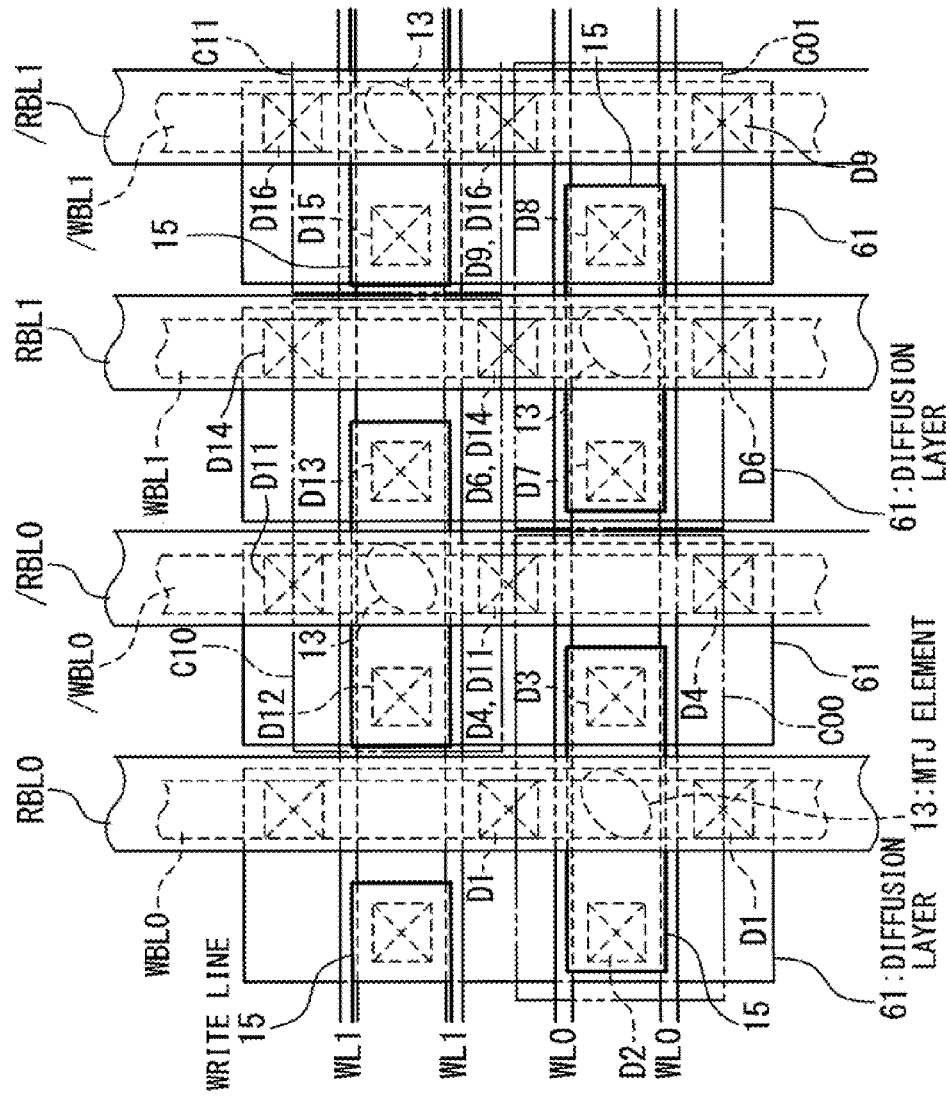
FIG. 9 is a plan view illustrating a layout of a memory array of the semiconductor storage device in the first embodiment of the present invention.
Figure 10:
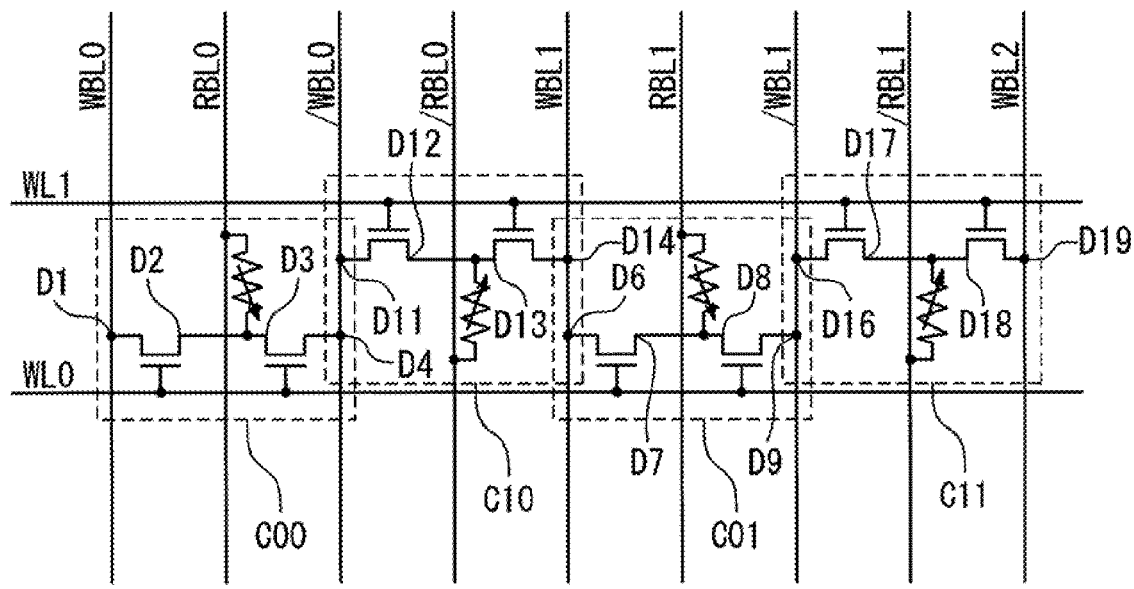
FIG. 10 is a circuit diagram corresponding to FIG. 9 extracted from FIG. 5.
Figure 11:
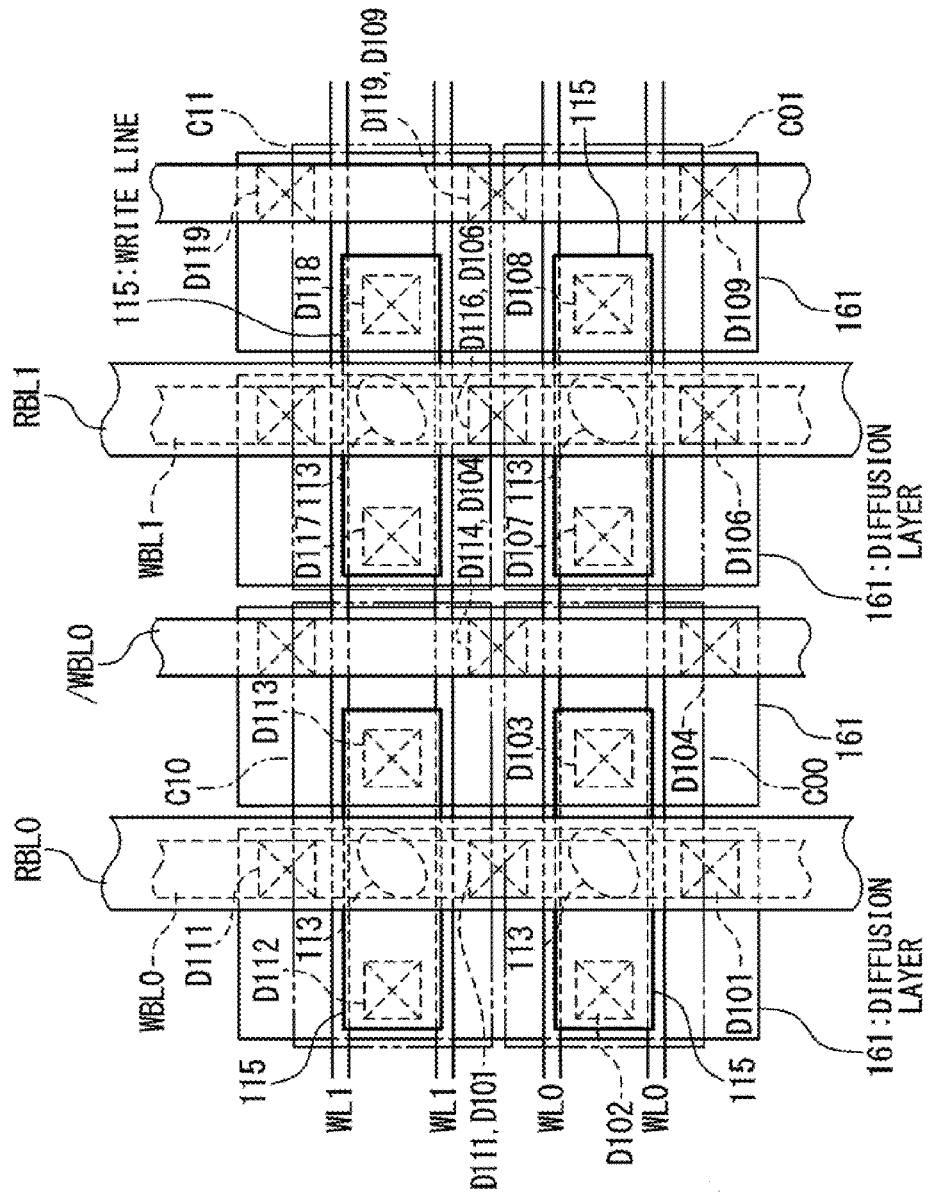
FIG. 11 is a plan view illustrating a layout of a memory array of the conventional 2T1MTJ cell type MRAM illustrated in FIG. 4.
Figure 12:
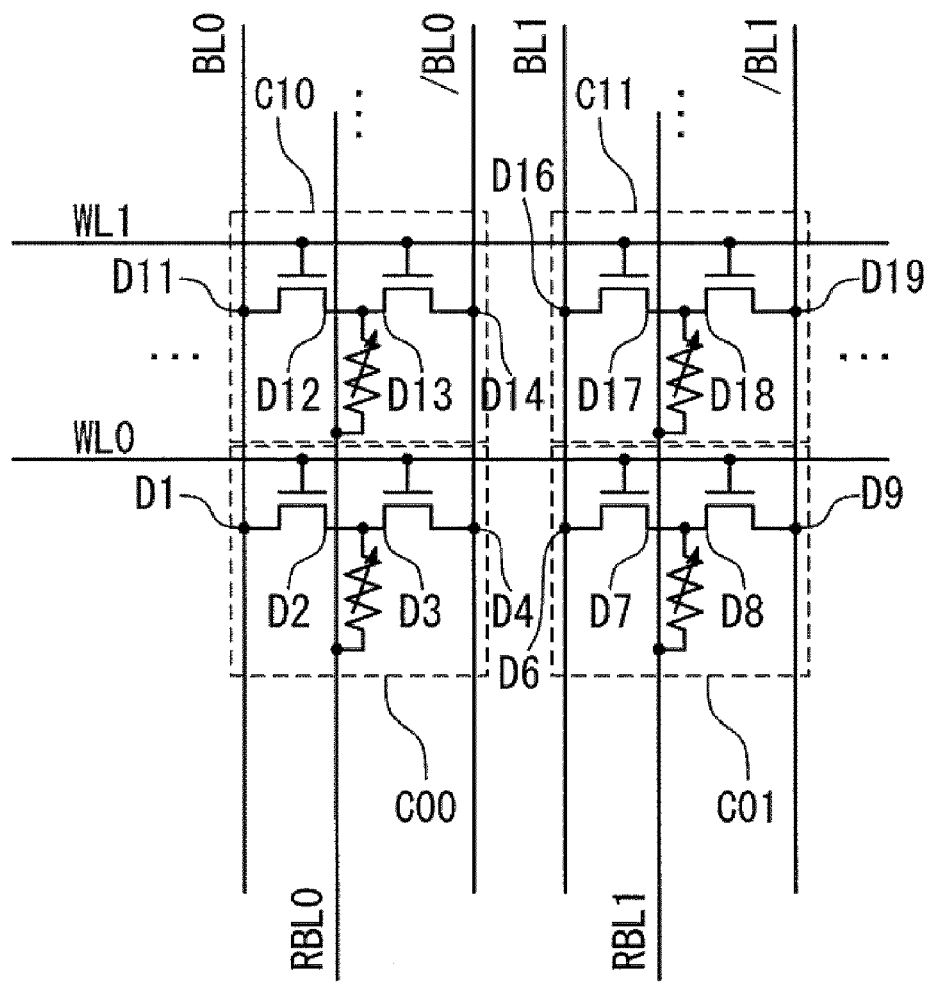
FIG. 12 is a circuit diagram corresponding to FIG. 11 extracted from FIG. 4.
Figure 13:
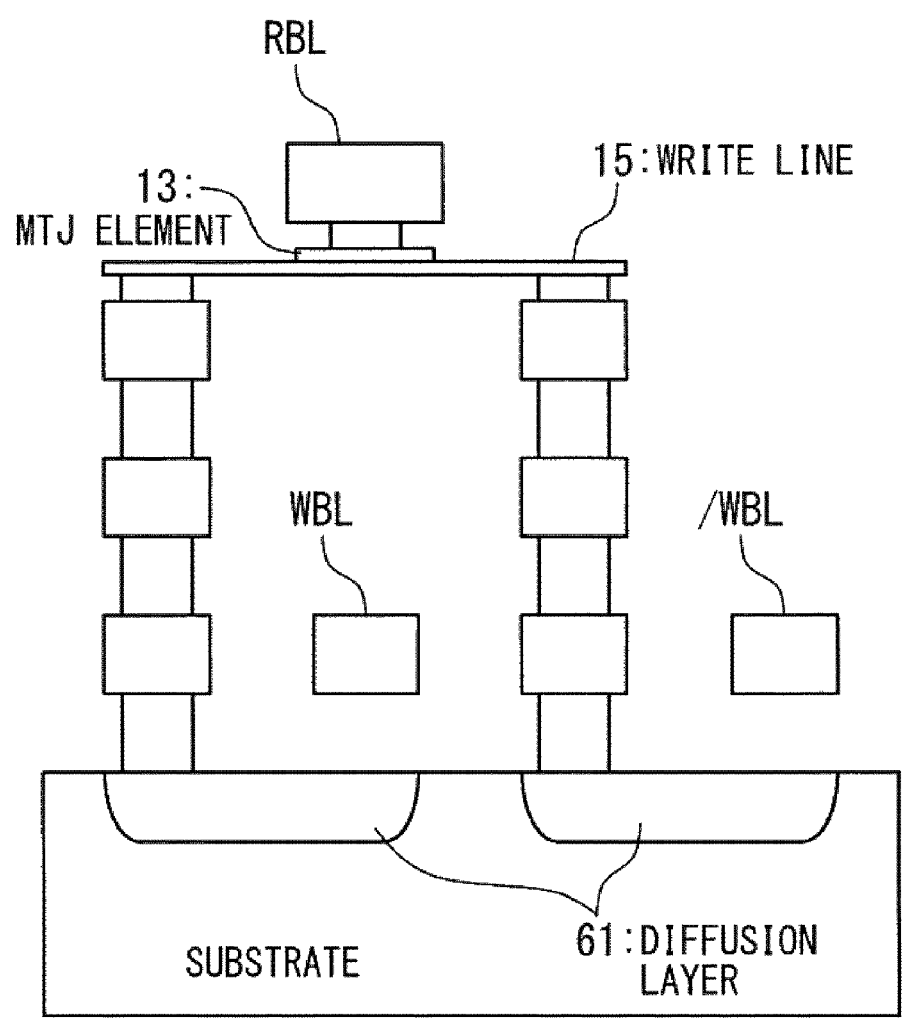
FIG. 13 is a cross-sectional view of one memory cell in FIG. 9.

FIG. 9 is a plan view illustrating a layout of the memory array of the semiconductor storage device in the first embodiment of the present invention. FIG. 10 is a circuit diagram corresponding to FIG. 9 extracted from FIG. 5. FIG. 13 is a cross-sectional view of one memory cell in FIG. 9. FIG. 11 is a plan view illustrating a layout of the memory array of the conventional 2T1MTJ cell type MRAM illustrated in FIG. 4. FIG. 12 is a circuit diagram corresponding to FIG. 11 extracted from FIG. 4.

In the circuit diagrams of FIGS. 10 and 12, example in which each memory cell C incorporates one first transistor 11 and one second transistor 12 are illustrated. However, as illustrated in FIGS. 9 and 11, each memory cell C may use dual gate transistors as the first and second transistors 11 and 12. That is, each memory cells C may have two first transistors 11 and two second transistors 2. In this case, two lines are provided for each of the word lines WLi.

In FIG. 9, for example, the first transistor 11 of the memory cell C00 is a dual gate transistor, which includes: a diffusion layer 61 connected to a contact D1; a gate provided under the word line WL0, and a diffusion layer 61 connected to a contact D2. Onto the contacts D1 and D2, the write bit line WBL0 and the write line 15 are connected, respectively. The second transistor 12 is a dual gate transistor, which includes: a diffusion layer 61 connected to a contact D4; a gate provided under the word line WL0; and a diffusion layer 61 connected to a contact D3. Onto the contacts D4 and D3, the write bit line /WBL0 and the write line 15 are connected, respectively. On the write line 15, the MTJ element 13 is arranged, which is connected to a write bit line RBL0 above the MTJ element 13.

Similarly, the first transistor 11 of the memory cell C10 is a dual gate transistor, which includes: a diffusion layer 61 connected to a contact D11; a gate provided under the word line WL1, and a diffusion layer 61 connected to a contact D12. Onto the contacts D11 and D12, the write bit line /WBL0 and the write line 15 are connected, respectively. The second transistor 12 is a dual gate transistor, which includes: a diffusion layer 61 connected to a contact D14; a gate provided under the word line WL1; and a diffusion layer 61 connected to a contact D13. Onto the contacts D14 and D13, the write bit line WBL1 and the write line 15 are connected, respectively. On the write line 15, the MTJ element 13 is arranged, which is connected to the write bit line /RBL0 above the MTJ element 13.

Similarly, the first transistor 11 of the memory cell C01 is a dual gate transistor, which includes: a diffusion layer 61 connected to a contact D6; a gate provided under the word line WL0, and a diffusion layer 61 connected to a contact D7. Onto the contacts D6 and D7, the write bit line WBL1 and the write line 15 are connected, respectively. The second transistor 12 is a dual gate transistor, which includes: a diffusion layer 61 connected to a contact D9; a gate provided under the word line WL0; and a diffusion layer 61 connected to a contact D8. Onto the contacts D9 and D8, the write bit line /WBL1 and the write line 15 are connected, respectively. On the write line 15, the MTJ element 13 is arranged, which is connected to the write bit line /RBL0 above the MTJ element 13. Other memory cells also have the same configuration.

It should be noted that, in the side in which the memory cells C00 and C10 are adjacent to each other, the contact D4 and the diffusion layer 61 connected to the contact D4, and the contact D11 and the diffusion layer 61 connected to the contact D11 are the same contact and diffusion layer, respectively, and ones of them are also used as the other ones. Similarly, in the side in which the memory cells C01 and C10 are adjacent to each other, the contact D6 and the diffusion layer 61 connected to the contact D6, and the contact D14 and the diffusion layer 61 connected to the contact D14 are the same contact and diffusion layer, respectively, and ones of them are also used as the other ones. That is, diffusion layers 61 and contacts are shared between memory cells along the word line WL0 and memory cells along the word line WL1. It should be noted that, for the dual gate transistor, diffusion layers and contacts are shared on both sides of the memory cells along the word lines WL. For the single gate transistor, on the other hand, diffusion layers and contacts are shared on one side of a memory cell along a word line WL. In either case, areas of diffusion layer and contacts are reduced, which is preferable.

In FIG. 11, for example, the first transistor 111 of a memory cell C00 is a dual gate transistor, which includes: a diffusion layer 161 connected to a contact D101; a gate provided under a word line WL0, and a diffusion layer 61 connected to a contact D102. Onto the contacts D101 and D102, the write bit line WBL0 and the write line 115 are connected, respectively. The second transistor 112 is a dual gate transistor, which includes: a diffusion layer 161 connected to a contact D104; a gate provided under the word line WL0; and a diffusion layer 161 connected to a contact D103. Onto the contacts D104 and D103, the write bit line /WBL0 and the write line 115 are connected, respectively. On the write line 115, the MTJ element 113 is arranged, which is connected to the write bit line RBL0 above the MTJ element 113.

Similarly, the first transistor 111 of a memory cell C10 is a dual gate transistor, which includes: a diffusion layer 161 connected to a contact D111; a gate provided under a word line WL1, and a diffusion layer 161 connected to a contact D112. Onto the contacts D111 and D112, the write bit line WBL0 and the write line 15 are connected, respectively. The second transistor 112 is a dual gate transistor, which includes: a diffusion layer 161 connected to a contact D114; a gate provided under the word line WL1; and a diffusion layer 61 connected to a contact D113. Onto the contacts D114 and D113, the write bit line /WBL0 and the write line 15 are connected, respectively. On the write line 15, the MTJ element 113 is arranged, which is connected to the write bit line RBL0 above the MTJ element 113.

It would be understood from comparison of FIG. 9 with FIG. 11 that layouts of the transistor layers (diffusion layer, gate (word line), contact D) are same. However, ways to draw the write lines (15, 115) are different. That is, in FIG. 9, a write bit line in an even-numbered column, and that in an odd-numbered column can be formed as the same interconnection. This allows the memory cells to be densely arranged, and therefore the memory array in FIG. 9 can be formed without increasing a cell area as compared with the memory cell array in FIG. 11. On the other hand, in the memory array described in Japanese Unexamined Patent Publication No. 2002-197852, an increase in cell area is unavoidable due to a dead area caused by zigzag arranging the memory cells.

Figure 1:
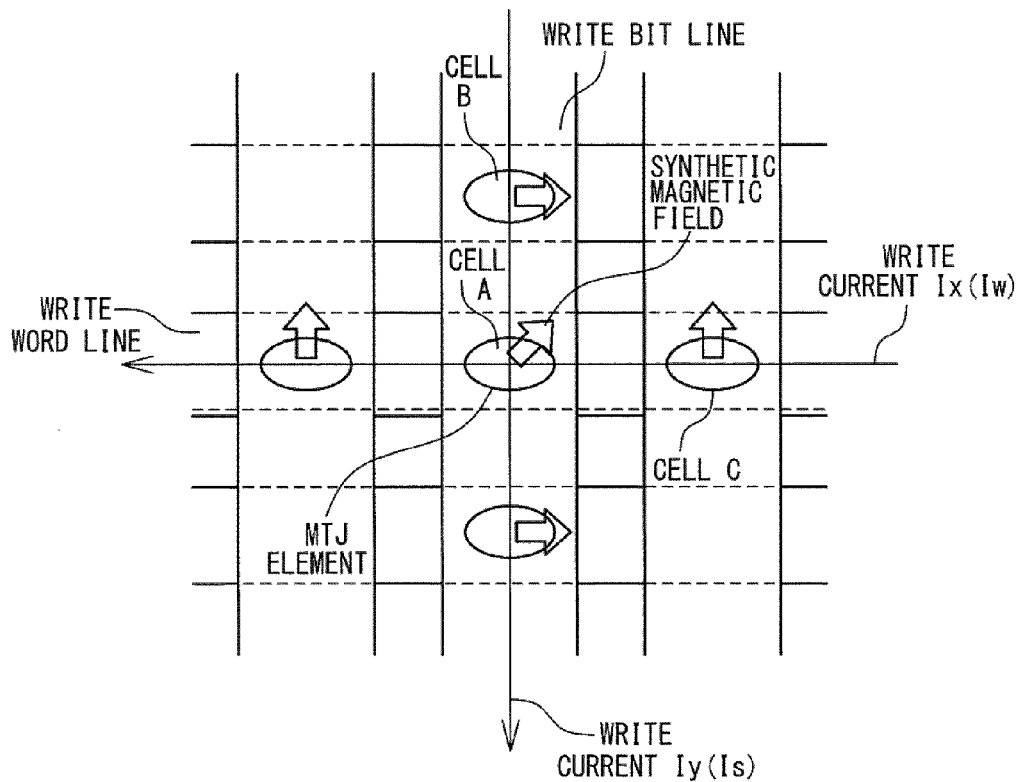
FIG. 1 is a schematic diagram illustrating a write principle of a typical MRAM.
Figure 2:
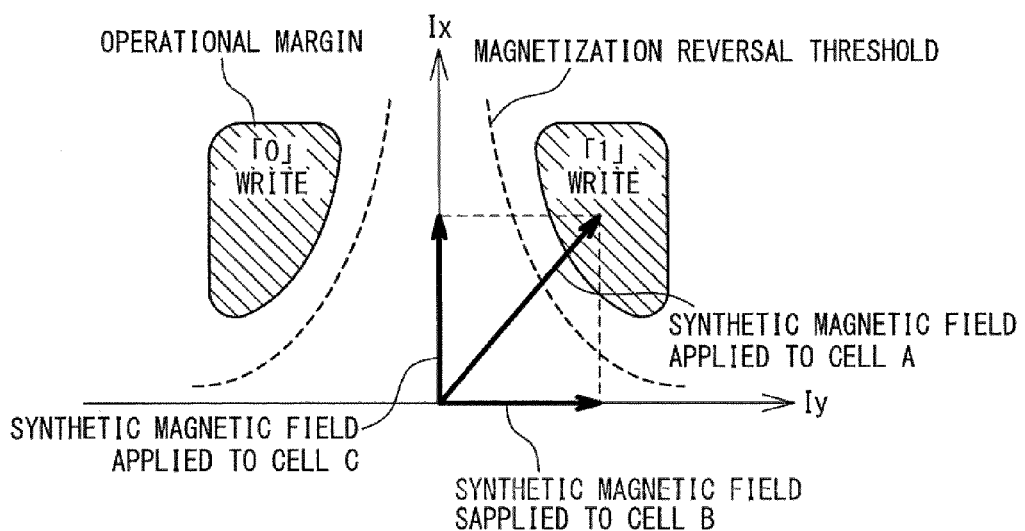
FIG. 2 is a graph illustrating a relationship between write currents and a write margin.
Figure 3:
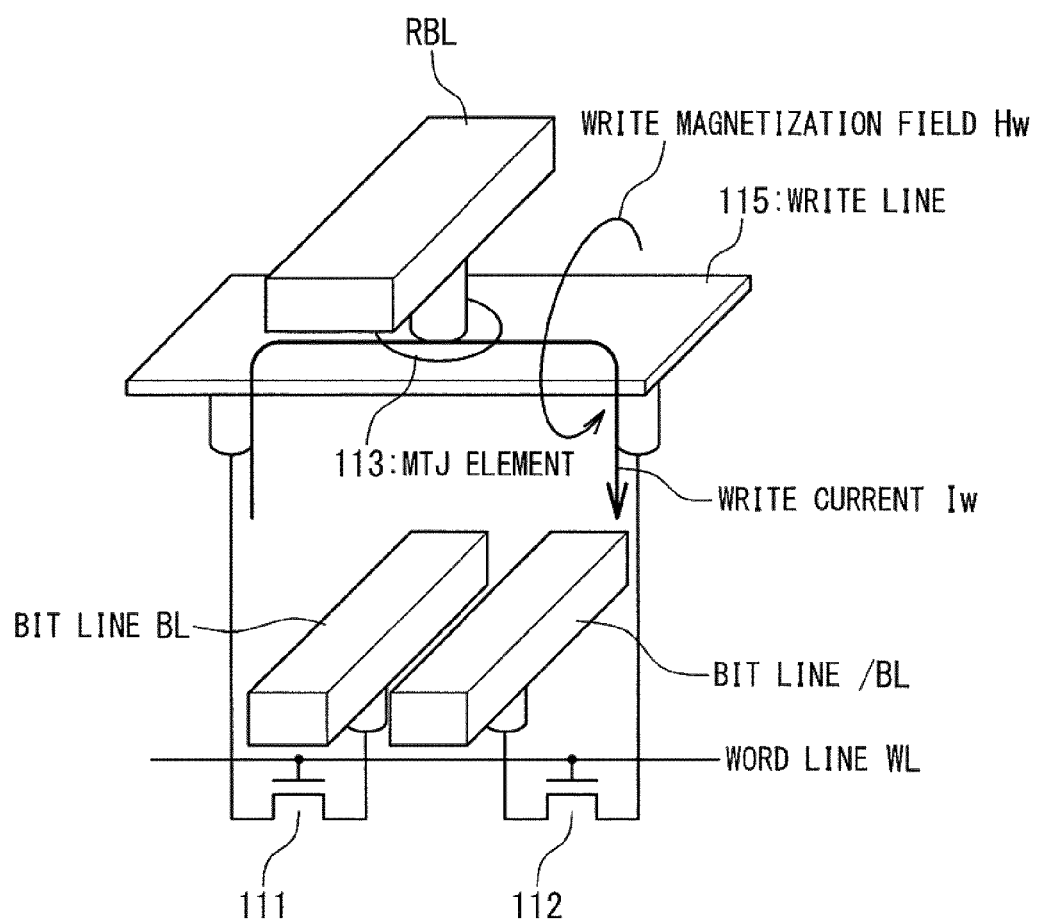
FIG. 3 is a schematic diagram illustrating a configuration of a 2T1MTJ cell in a conventional technique.
Figure 4:
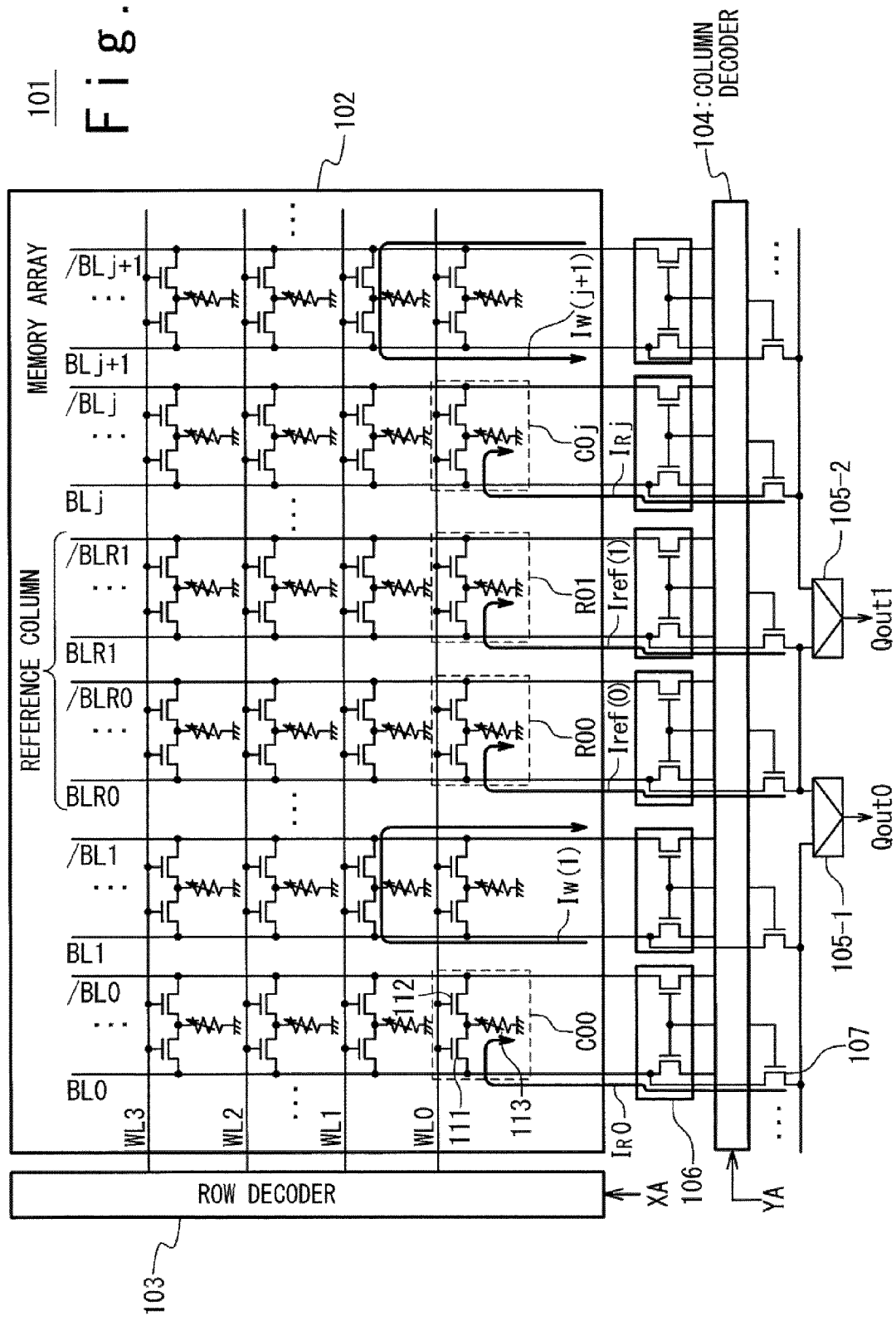
FIG. 4 is a circuit block diagram illustrating a basic configuration of an MRAM using 2T1MTJ cells.

Also, a read speed can be dramatically increased as compared with a conventional memory array illustrated in FIG. 4 in this embodiment. In the conventional MRAM cell (FIG. 4, and 1T1MTJ cell (1-Transistor-1-MTJ element type cell) described in Japanese Laid-Open Patent Application No. JP-A 2002-197852), a bit line is shared between reading and writing. For this reason, a write circuit (or a current switch for driving a write current) is added to the bit line. As a result, the load capacitance of the bit line is increased, which causes a reduction in read speed. Also, in a write method using an MTJ reversal threshold curve described in Japanese Laid-Open Patent Application No. JP-A 2002-197852, it is difficult to reduce a write time to 10 ns or less because of reasons such as complexity of the write circuit. Accordingly, even if a read time is reduced to 10 ns or less, the random access time will inevitably be 10 ns or more.

In this embodiment, on the other hand, different bit lines (read bit line and write bit line) are used for reading and writing. For this reason, the load capacitance of the read bit lines is reduced. In addition, in this embodiment, the number of the MTJ elements 13 connected to one read bit line is reduced to ½ as compared with the conventional case as is clear from the comparison between FIGS. 9 and 11. The capacitance of the tunnel insulating film of the MTJ element is very large as compared with the interconnection capacitance. For this reason, the load capacitance of the read bit lines is significantly reduced by the reduction of the number of the MTJ elements. Further, the load capacitances of the read bit lines RBL and /RBL are the same. For this reason, settling times of the sense signal and the reference signal can be made equal to each other. Accordingly, even if the sense signal and the reference signal are not settled, sensing can be performed with high reliability if the differential signal between them is sufficiently large. For the above-described reasons, the read time, which has been 10 ns or more in the conventional MRAM, can be shorten to approximately 5 ns in this embodiment. Essentially, the 2T1MTJ cell uses a cell system that can shorten the write time to approximately 1 ns. Accordingly, the present invention provides speed-up of the random access time of the MRAM to approximately 5 ns. This random access time is almost equal to a random access time required for SRAM macros included in many system LSIs.

As described above, this invention allows obtaining a semiconductor storage device that can perform high-speed operations (read operation and write operation) as in the SRAM. Also, a semiconductor storage device using the 2T1MTJ cell, which can perform a high-speed read operation without cell area overhead, can be obtained.

Second Embodiment

Figure 14:
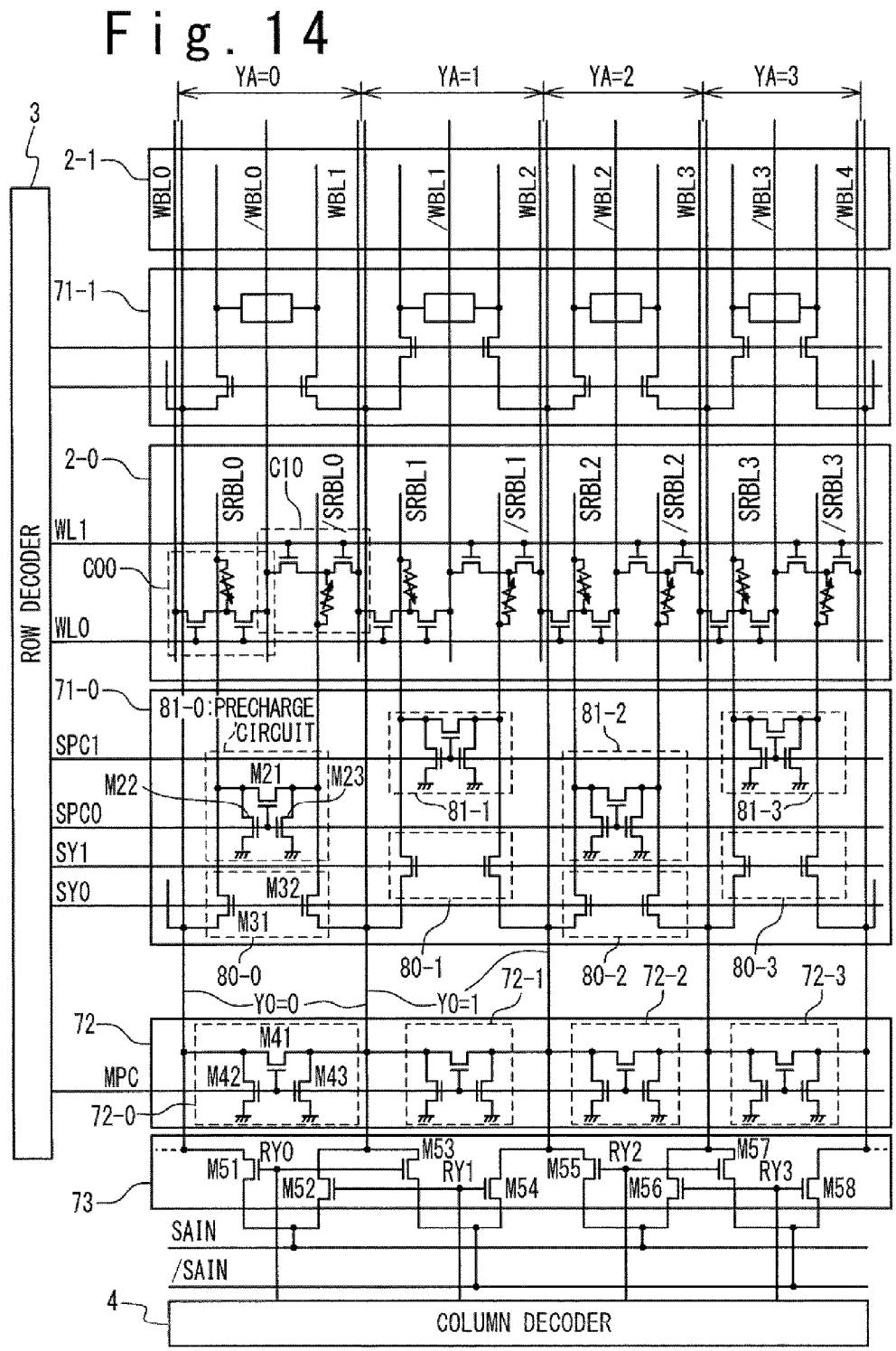
FIG. 14 is a circuit block diagram illustrating the configuration of the semiconductor storage device in a second embodiment of the present invention.

FIG. 14 is a circuit block diagram illustrating a configuration in a second embodiment of the semiconductor storage device of the present invention. It should be noted that the path of the sense current in the read operation is also illustrated in FIG. 14.

In order to further reduce the load capacitance of a read bit line RBL, this embodiment is designed differently from the first embodiment in that the memory array 2 is divided into a plurality of memory arrays 2-$r$ ($r$=0 to p: p is a natural number). It should be noted that, in this embodiment, the arrangement of the memory cells C and the write operation in each memory array 2-$r$ are the same as those in the first embodiment, and therefore descriptions thereof are omitted. It should be also noted that although the description is given of FIG. 5 on an assumption that two memory cells C are simultaneously selected, it is assumed in FIG. 14 that one memory cell C is selected for convenience of description.

The semiconductor storage device 1 of this embodiment has basically the same configuration as in the first embodiment. However, the configurations of the memory array 2 and the first switch section 6 are different from those in the first embodiment. It should be noted that the second switch section 8, the selector 9, and the sense amplifier 5, which are illustrated in FIG. 5, are omitted in the drawings. In this embodiment, the plurality of memory arrays 2-$r$ and a plurality of sub decoders 71-$r$ are provided in place of the memory array 2. Also, a plurality of precharge circuits 72-$j$ and a third switch section 73 are provided in place of the first switch section 6.

Sub read bit lines SRBLj and /SRBLj are provided in each of the plurality of memory cells 2-$r$. The sub read bit lines SRBLj and /SRBLj correspond to the read bit lines RBLj and /RBLj in the first embodiment.

Main read bit lines MRBLj are provided so as to be shared among the plurality of memory cells 2-$r$. The main read bit lines MRBLj are connected to sub read bit lines /SRBL(j−1) and SRBLj in each of the plurality of memory cells 2-$r$ through a corresponding sub decoder 71-$r$. It should be noted that a dummy sub read bit line SRBL (not illustrated) is added for the main read bit line at the side of the memory array 2, for example, the main read bit line MRBL0, in order to make load capacitances of the main read bit lines MRBL uniform.

The memory arrays 2-$r$ correspond to the memory array 2 in the first embodiment. However, the write bit lines WBL and /WBL are routed over the plurality of memory arrays 2-$r$ in common (or shared). On the other hand, the sub read bit lines SRBLj and /SRBLj as the read bit lines RBLj and /RBLj in the first embodiment are routed within each of the memory arrays 2-$r$.

A sub decoder 71-$r$ is provided for the memory array 2-$r$. The sub decoder 71-$r$ includes a plurality of fourth switch sections 80-$j$ and a plurality of precharge circuits 81-$j$. The fourth switch section 80-$j$ and precharge circuit 81-$j$ are provided for each of pairs formed by even-numbered columns and odd-numbered columns that are adjacent to each other, i.e., for each of pairs of the sub read bit lines SRBLj and/ SRBLj.

The fourth switch section 80-$j$ includes transistors M31 and M32. The transistor M31 connects the sub read bit line SRBLj to the main read bit line MRBLj. The transistor M32 connects the sub read bit line /SRBLj to the main read bit line MRBL(j+1). The precharge circuit 81-$j$ precharges the sub read bit lines SRBLj and /SRBLj to a predetermined voltage (GND in the example of the diagram) in the standby state. The precharge circuit 81-$j$ includes transistors M21, M22, and M23.

The precharge circuit 72-$j$ precharges the main read bit lines MRBLj and MRBL(j+1) to a predetermined voltage (GND in the example of the diagram) in the standby state. The precharge circuit 72-j includes transistors M41, M42, and M43.

The column decoder 4 outputs a control signal RYi to allow connecting the main read bit line MRBLj to any of the input line SAIN and /SAIN which are connected to one of the input terminals of the sense amplifier depending on the state of Y0. The third switch section 73 connects the main read bit lines MRBLj and MRBL(j+1) to the input lines SAIN and /SAIN, respectively, on the basis of the control signal RYj from the column decoder 4.

In this embodiment, the memory array 2 is divided into the plurality of memory arrays 2-r by using the plurality of sub decoders 71-r, which include the fourth switch section 80 that electrically connects the sub read bit lines SRBLj and /SRBLj to the main read bit line MRBLj.

In this embodiment, the main read bit line MRBLj is shared on the basis of whether the column address (YA) is "even or odd", i.e., between adjacent even-numbered and odd-numbered pairs among pairs formed by adjacent even-numbered and odd-numbered columns, in order to make the load capacitances of the main read bit lines MRBLj uniform, and also in order to reduce the number of interconnections. That is, the main read bit line MRBLj is electrically connected to any of the sub read bit lines /SRBL(j−1) and SRBLj on the basis of a state of a least significant bit Y0 of the column address (YA) (whether an even number or an odd number).

Next, a read operation of the semiconductor storage device in the second embodiment of the present invention is described referring to FIG. 14.

In the standby state before the read operation, decode signals SY0 and SY1 outputted from the row decoder 3 are set to the L level. As a result, the transistors M31 and M32 of the fourth switch section 80-j controlled by the decode signals SY0 and SY1 are placed into the off state. This results in that the sub read bit line SRBLj and the main read bit line MRBLj are electrically disconnected. The sub read bit line /SRBLj and the main read bit line MRBL(j+1) are electrically disconnected.

Decode signals SPC0 and SPC1 outputted from the row decoder 3 are set to the H level. As a result, the transistors M21, M22, and M23 of the precharge circuit 81-j controlled by the decode signals SPC0 and SPC1 are set to the on state. As a result, the sub read bit lines SRBLj and /SRBLj are placed into the GND-precharged state.

A decode signal MPC outputted from the row decoder 3 is set to the H level. As a result, the transistors M41, M42 and M43 of the precharge circuit 71-r controlled by the decode signal MPC are placed into the on state. This results in that all of the main read bit lines MRBLj are into the GND-precharged state.

The control signal RYj outputted from the column decoder 4 is set to the L level. As a result, transistors M51, M52, . . . of the third switch section 73 controlled by the control signal RYj are all placed into the off state. This results in that all of the main read bit line MRBLj and the input lines SAIN and /SAIN are electrically disconnected.

Next, in the read mode (in the read operation), when the least significant bit Y0 of the column address (YA) is 0 (the column address YA is assumed to be 0), the decode signal SY0 from the row decoder 3 is set to the H level, the decode signal SPC0 to the L level, and the decode signal MPC to the L level. At this time, the transistors M21 to M23 of the precharge circuit 81-0 of the sub decoder 71-0 are placed into the off state, and the transistors M31 and M32 of the fourth switch section 80-0 into the on state. This results in that the sub read bit line SRBL0 is connected to the main read bit line MRBL0 and the sub read bit line /SRBL0 is connected to the main read bit line MRBL1, respectively.

Also, the control signal RI0 from the column decoder 4 is activated to thereby place the transistors M51 and M53 of the third switch section 73 into the on state. As a result, the main read bit line MRBL0 is connected to the input line SAIN and the main read bit line MRBL1 is connected to the input line /SAIN, respectively. That is, a sense current Is supplied from the sense amplifier 5 flows into the sub read bit line SRBL0 from the input line SAIN through the main read it line MRBL0. On the other hand, a sense current /Is supplied from the sense amplifier 5 flows into the sub read bit line /SRBL0 from the input line /SAIN through the main read bit line MRBL1.

On the other hand, when the least significant bit Y0 of the column address (YA) is 1 (YA is assumed to be 1), the decode signal SY1 from the row decoder 3 is brought to the H level, the decode signal SPC1 to the L level, and the decode signal MPC to the L level. At this time, the transistors M21 to M23 of the precharge circuit 81-1 of the sub decoder 71-0 are placed into the off state, and the transistors M31 and M32 of the fourth switch section 80-1 into the on state. This results in that the sub read bit line SRBL1 is connected to the main read bit line MRBL1 and the sub read bit line /SRBL1 is connected to the main read bit line MRBL2, respectively.

Also, the control signal RY1 from the column decoder 4 is activated to thereby place the transistors M52 and M54 of the third switch section 73 into the on state. As a result, the main read bit line MRBL1 is connected to the input line SAIN and the main read bit line MRBL2 is connected to the input line /SAIN, respectively. That is, the sense current Is supplied from the sense amplifier 5 flows into the sub read bit line SRBL1 from the input wiring SAIN through the main read bit line MRBL1. On the other hand, the sense current /Is supplied from the sense amplifier 5 flows into the sub read bit line /SRBL1 from the input line /SAIN through the main read bit line MRBL2.

As described above, this embodiment, the load capacitance of the read bit lines are reduced by dividing a memory array with the memory bit capacitance kept unchanged. This allows achieving speed-up so that settling times of the sense signal and the reference signal are further shortened (5 ns or less) than in the first embodiment. Also, by sharing a main read bit line on the basis of whether a column address is "even or odd", load capacitances of sense current paths can be completely matched, and therefore a higher-speed read operation can be achieved.

In the following, a summary of various embodiments of the present invention is described.

In one embodiment of the present invention, a semiconductor storage device is provided with a memory array including a plurality of memory cells. The plurality of memory cells includes: first and third memory cells arranged along one of an even-numbered row and an odd-numbered row, and a second memory cell arranged along the other. Each of the plurality of memory cells includes: a first transistor comprising first and second diffusion layers; a second transistor comprising third and fourth diffusion layers; and a magnetoresistance element having one of terminals thereof connected to an interconnection layer which provides an electrical connection between the second and third diffusion layers. The fourth diffusion layer of the first memory cell is also used as the first diffusion layer of the second memory cell. In addition, the fourth diffusion layer of the second memory cell is also used as the first diffusion layer of the third memory cell.

In one embodiment, the first diffusion layer is connected to a first interconnection. The fourth diffusion layer is connected to a second interconnection. The other terminal of the magnetoresistance element is connected to a third interconnection. The second interconnection of the first memory cell is also used as the first interconnection of the second memory cell. The second interconnection of the second memory cell is also used as the first interconnection of the third memory cell.

In one embodiment, the memory array further includes reference cell rows including a plurality of reference cells. The plurality of reference cells include first and third reference cells arranged along a first row of the reference cell rows; and a second reference cell arranged along a second row of the reference cell rows. The plurality of reference cells are same as the plurality of memory cells (C) in terms of configuration.

In one embodiment, a first read bit line extending in the memory array is the third interconnections of the first memory cell and first reference cell. A second read bit line extending in the memory array is the third interconnections of the second memory cell and the second reference cell. In a read operation, the second reference cell is selected when the first memory cell is selected. When the second memory cell is selected, the first reference cell is selected.

In one embodiment, the semiconductor storage device further includes a selector that, in the read operation, sets connections of the first read bit line and the second read bit line with a sense amplifier into any of first and second connection states. The first connection state is a state where the first read bit line is connected to a first input terminal of the sense amplifier, and the second read bit line is connected to a second input terminal of the sense amplifier. The second connection state is a state where the first read bit line is connected to the second input terminal of the sense amplifier, and the second read bit line is connected to the first input terminal of the sense amplifier. The selector sets the first connection state and the second connection state on the basis of whether a row address of the memory array is even or odd.

In one embodiment, a first write bit line extending in the memory array is the first interconnection of the first memory cell. A second write bit line extending in the memory array is the second interconnection of the first memory cell, and also the first interconnection of the second memory cell. A third write bit line extending in the memory array is the second interconnection of the second memory cell. In a write operation, the first write bit line and the second write bit line are applied with complementary voltages depending on write data when the first memory cell is selected. When the second memory cell is selected, the second write bit line and the third write bit line are applied with the complementary voltages depending on the write data.

In one embodiment, the memory array further includes a plurality of sub memory arrays, and a plurality of sub decoders provided for the plurality of sub memory arrays, respectively. Each of the plurality of sub decoders includes a switch section that electrically connects a first main read bit line with the third interconnection of the first memory cell, and electrically connects a second main read bit line with the third interconnection of the second memory cell. The first main read bit line and the second main read bit line are routed over the plurality of sub memory arrays in common. The first interconnection and the second interconnection in the first memory cell and the second memory cell are routed over the plurality of sub memory arrays in common.

In one embodiment, the first main read bit line and the second main read bit line are shared between the first and second memory cells which correspond to different column addresses and are adjacent to each other.

In one embodiment, the semiconductor storage device further includes a selector that sets connections of the first and second main read bit lines with the sense amplifier into any of first and second connection states in the read operation. The first connection state is a state where the first main read bit line is connected to the first input terminal of the sense amplifier, and the second main read bit line is connected to the second input terminal of the sense amplifier. The second connection state is a state where the first main read bit line is connected to the second input terminal of the sense amplifier, and the second main read bit line is connected to the first input terminal of the sense amplifier. The selector sets the first connection state or the second connection state on the basis of whether the column address of the memory array is even or odd.

In one embodiment, each of the plurality of sub decoders further includes a precharge section that precharges the third interconnection of the first memory cell and the third interconnection of the second memory cell to a predetermined voltage.

Although the present invention has been described above referring to the embodiments, the present invention is not limited to any of the above-described embodiments. One skilled in the art would appreciate that the configuration and details of the present invention may be variously changed within the scope of the present invention.

The invention claimed is:

1. A semiconductor storage device comprising:
a memory array including a plurality or memory cells,
wherein said plurality of memory cells include:
first and third memory cells arranged along one of an even-numbered row and an odd-numbered row, and
a second memory cell arranged along the other,
wherein each of said plurality of memory cells includes:
a first transistor comprising first and second diffusion layers;
a second transistor comprising third and fourth diffusion layers; and
a magnetoresistance element having one of terminals thereof connected to an interconnection layer which provides an electrical connection between said second and third diffusion layers,
wherein said fourth diffusion layer of said first memory cell is also used as said first diffusion layer of said second memory cell, and
wherein said fourth diffusion layer of said second memory cell is also used as said first diffusion layer of said third memory cell.

2. The semiconductor storage device according to claim 1, wherein said first diffusion layer is connected to a first interconnection,
wherein said fourth diffusion layer is connected to a second interconnection,
wherein the other terminal of the magnetoresistance element is connected to a third interconnection,
wherein said second interconnection of said first memory cell is also used as said first interconnection of said second memory cell, and
wherein said second interconnection of the second memory cell is also used as said first interconnection of the third memory cell.

3. The semiconductor storage device according to claim 2, wherein said memory array further includes reference cell rows comprising a plurality of reference cells,
wherein said plurality of reference cells include:
first and third reference cells arranged along a first row of the reference cell rows; and a second reference cell arranged along a second row of the reference cell rows, and wherein said plurality of reference cells are same as said plurality of memory cells in terms of configuration.

4. The semiconductor storage device according to claim 3, wherein a first read bit line extending in the memory array is said third interconnections of said first memory cell and said first reference cell, wherein a second read bit line extending in the memory array is said third interconnections of said second memory cell and said second reference cell, and wherein, in a read operation, said second reference cell is selected when said first memory cell is selected, and said first reference cell is selected when said second memory cell is selected.

5. The semiconductor storage device according to claim 4, further comprising a selector that, in the read operation, sets connections of said first read bit line and said second read bit line with a sense amplifier into any of first and second connection states, wherein said first connection state is a state where said first read bit line is connected to a first input terminal of said sense amplifier, and said second read bit line is connected to a second input terminal of said sense amplifier, wherein said second connection state is a state where said first read bit line is connected to said second input terminal of said sense amplifier, and said second read bit line is connected to said first input terminal of said sense amplifier, and wherein said selector sets said first connection state and said second connection state based on whether a row address of said memory array is even or odd.

6. The semiconductor storage device according to claim 3, wherein a first write bit line extending in said memory array is said first interconnection of said first memory cell, wherein a second write bit line extending in said memory array is said second interconnection of said first memory cell, and also said first interconnection of said second memory cell, wherein a third write bit line extending in said memory array is said second interconnection of said second memory cell, wherein, in a write operation, said first write bit line and said second write bit line are applied with complementary voltages depending on write data when said first memory cell is selected, and said second write bit line and said third write bit line are applied with said complementary voltages depending on write data when said second memory cell is selected.

7. The semiconductor storage device according to claim 3, wherein said memory array further includes:

a plurality of sub memory arrays; and a plurality of sub decoders provided for said plurality of sub memory arrays, respectively, wherein each of said plurality of sub decoders includes a switch section that electrically connects a first main read bit line with said third interconnection of said first memory cell, and electrically connects a second main read bit line with said third interconnection of said second memory cell, wherein said first main read bit line and said second main read bit line are routed over said plurality of sub memory arrays in common, and wherein said first interconnection and said second interconnection in said first memory cell and said second memory cell are routed over said plurality of sub memory arrays in common.

8. The semiconductor storage device according to claim 7, wherein said first main read bit line and said second main read bit line are shared between said first and second memory cells which correspond to different column addresses and are adjacent to each other.

9. The semiconductor storage device according to claim 8, further comprising a selector that sets connections of said first and second main read bit lines with said sense amplifier into any of first and second connection states in the read operation, wherein said first connection state is a state where said first main read bit line is connected to said first input terminal of said sense amplifier, and said second main read bit line is connected to said second input terminal of said sense amplifier, wherein said second connection state is a state where said first main read bit line is connected to said second input terminal of said sense amplifier, and said second main read bit line is connected to said first input terminal of said sense amplifier, and wherein said selector sets said first connection state or said second connection state on the basis of whether said column address of said memory array is even or odd.

10. The semiconductor storage device according to claim 7, wherein each of said plurality of sub decoders further includes a precharge section that precharges said third interconnection of said first memory cell and said third interconnection of said second memory cell to a predetermined voltage.

* * * * *